(12) United States Patent
Pan et al.

(10) Patent No.: US 10,680,145 B2
(45) Date of Patent: Jun. 9, 2020

(54) LED PACKAGE STRUCTURE AND METHOD FOR MANUFACTURING SAME

(71) Applicant: EVERLIGHT ELECTRONICS CO., LTD., New Taipei (TW)

(72) Inventors: Ke-Hao Pan, New Taipei (TW);
Sheng-Wei Chou, New Taipei (TW);
Yi-Sheng Lan, New Taipei (TW);
Chia-Fong Chou, New Taipei (TW);
Chung-Chuan Hsieh, New Taipei (TW); Jen-Hao Pan, New Taipei (TW);
Hao-Yu Yang, New Taipei (TW);
Chieh-Yu Kang, New Taipei (TW);
Tzu-Lun Tseng, New Taipei (TW)

(73) Assignee: EVERLIGHT ELECTRONICS CO., LTD., New Taipei (TW)

(*) Notice: Subject to any disclaimer, the term of this patent is extended or adjusted under 35 U.S.C. 154(b) by 0 days.

(21) Appl. No.: 16/054,987

(22) Filed: Aug. 3, 2018

(65) Prior Publication Data

US 2019/0044036 A1  Feb. 7, 2019

Related U.S. Application Data

(60) Provisional application No. 62/541,113, filed on Aug. 4, 2017, provisional application No. 62/556,866, filed
(Continued)

(51) Int. Cl.
*H01L 33/00* (2010.01)
*H01L 33/50* (2010.01)
(Continued)

(52) U.S. Cl.
CPC .......... *H01L 33/505* (2013.01); *G02B 5/0278* (2013.01); *H01L 33/36* (2013.01);
(Continued)

(58) Field of Classification Search
USPC .............................. 257/40, 13, 79–103, 918, 257/E51.018–E51.022, E33.001–E33.077,
(Continued)

(56) References Cited

U.S. PATENT DOCUMENTS

| 4,733,335 A | 3/1988 | Serizawa et al. |
| 2002/0024822 A1 | 2/2002 | Pond et al. |

(Continued)

FOREIGN PATENT DOCUMENTS

| CN | 1598396 A | 3/2005 |
| CN | 1837852 A | 9/2006 |

(Continued)

OTHER PUBLICATIONS

The Chinese International Search Report of corresponding international PCT application No. PCT/CN2018/076737, dated May 22, 2018.
(Continued)

*Primary Examiner* — Niki H Nguyen
(74) *Attorney, Agent, or Firm* — J. C. Patents

(57) ABSTRACT

The present disclosure provides an LED package structure and a method for manufacturing the LED package structure. The LED package structure includes: a chip scale package (CSP) light emitting element and a shading layer, where the CSP light emitting element includes a light emitting chip, and the light emitting chip includes an electrode group located on a bottom surface of the light emitting chip, the shading layer is disposed on a bottom surface and/or a side surface of the CSP light emitting element. An LED package structure according to the present disclosure solves a problem that the blue light leaking from the bottom surface of the LED chip interferes with the emission color of the CSP emitting device, and reduces the luminous efficiency of the emitting device.

28 Claims, 20 Drawing Sheets

Related U.S. Application Data on Sep. 11, 2017, provisional application No. 62/613,056, filed on Jan. 3, 2018.

(51) Int. Cl.
*H01L 33/52* (2010.01)
*G02B 5/02* (2006.01)
*H01L 33/36* (2010.01)
*H01L 33/54* (2010.01)
*H01L 33/44* (2010.01)
*H01L 33/62* (2010.01)

(52) U.S. Cl.
CPC ............. *H01L 33/44* (2013.01); *H01L 33/52* (2013.01); *H01L 33/54* (2013.01); *H01L 33/62* (2013.01); *H01L 2933/0033* (2013.01)

(58) Field of Classification Search
USPC .......... 257/E33.054, E25.028, E25.032, 458, 257/656, E31.058, E31.063, E31.115, 257/E27.133–E27.139; 438/27, 29, 33, 438/34
See application file for complete search history.

(56) References Cited

U.S. PATENT DOCUMENTS

| | | | |
|---|---|---|---|
| 2012/0112227 A1* | 5/2012 | Toyama | H01L 25/0753 257/98 |
| 2015/0108523 A1* | 4/2015 | Kotani | H01L 33/505 257/98 |
| 2016/0118552 A1* | 4/2016 | Kim | H01L 33/54 438/7 |
| 2018/0138378 A1* | 5/2018 | Hung | H01L 33/56 |

FOREIGN PATENT DOCUMENTS

| | | |
|---|---|---|
| CN | 101082398 A | 12/2007 |
| CN | 101446775 A | 6/2009 |
| CN | 101761787 A | 6/2010 |
| CN | 201540906 U | 8/2010 |
| CN | 102213841 A | 10/2011 |
| CN | 102569595 A | 7/2012 |
| CN | 202363509 U | 8/2012 |
| CN | 102798341 A | 11/2012 |
| CN | 102865540 A | 1/2013 |
| CN | 103022313 A | 4/2013 |
| CN | 103311800 A | 9/2013 |
| CN | 203177057 U | 9/2013 |
| CN | 203273399 U | 11/2013 |
| CN | 103438402 A | 12/2013 |
| CN | 103982784 A | 8/2014 |
| CN | 104534379 A | 4/2015 |
| CN | 104620044 A | 5/2015 |
| CN | 104854716 A | 8/2015 |
| CN | 105006508 A | 10/2015 |
| CN | 105006512 A | 10/2015 |
| CN | 105449071 A | 3/2016 |
| CN | 105449080 A | 3/2016 |
| CN | 205402343 U | 7/2016 |
| CN | 106098679 A | 11/2016 |
| CN | 106104354 A | 11/2016 |
| CN | 106784250 A | 5/2017 |
| DE | 10 2015 107 067 A1 | 11/2016 |
| JP | 2012-227470 A | 11/2012 |
| JP | 2016-015263 A | 1/2016 |
| JP | 2016-213014 A | 12/2016 |
| KR | 10-2009-0036311 A | 4/2009 |
| KR | 2015-0072064 A | 6/2015 |

OTHER PUBLICATIONS

The Chinese International Search Report of corresponding international PCT application No. PCT/CN2018/076816, dated May 15, 2018.
The Chinese International Search Report of corresponding international PCT application No. PCT/CN2018/096541, dated Nov. 13, 2018.
The Chinese First Examination Report of corresponding Chinese application No. 201810028903.9, dated Jun. 4, 2019.
The Chinese First Examination Report of corresponding Chinese application No. 201810534045.5, dated Aug. 5, 2019.
The Chinese First Examination Report of corresponding Chinese application No. 201810879405.5, dated Jul. 26, 2019.

* cited by examiner

LED PACKAGE STRUCTURE AND METHOD FOR MANUFACTURING SAME

CROSS-REFERENCE TO RELATED APPLICATION

This disclosure claims priority to U.S. provisional patent application Ser. No. 62/541,113, filed on Aug. 4, 2017, U.S. provisional patent application Ser. No. 62/556,866, filed on Sep. 11, 2017, and U.S. provisional patent application Ser. No. 62/613,056, filed on Jan. 3, 2018, which are hereby incorporated by reference in their entireties.

TECHNICAL FIELD

The present disclosure relates to the field of luminescence sensing and, more particularly, to a Light Emitting Diode (LED) package device and a method for manufacturing the LED package device.

BACKGROUND

Chip Scale Package (CSP) is an advanced category of integrated circuit packaging. When manufacturing a CSP light emitting device, an LED chip is typically covered by a package structure, where the package structure is made of a resin material including a fluorescent material and a reflecting material. Package dimensions and cost can be reduced during the packaging process of the CSP, the diversity of customer designs can be enhanced, thereby resulting in the popularity of the applications of CSP.

Currently, when the CSP emitting device is manufactured, the LED chip is placed in a mold, and the package resin is injected into the mold to overlay an upper surface and a side surface of the LED chip. Typically, in order to ensure a better connectivity between the electrode group and a circuit board of an application end, a bottom surface of the LED chip is not to he covered by the package resin during the packaging due to the existence of an electrode group arranged on the bottom surface of the LED chip. With this approach, an LED chip of a single CSP emitting device, which is fabricated through molding, cutting and detaching, will have its side surface and upper surface covered with package resin, while the bottom surface and the electrode group are not covered with package resin.

However, the above method results in a bare bottom surface of an LED chip of the fabricated CSP light emitting device, causing a leaking of blue light from the bottom surface when the CSP emitting device is being used. The leaked blue light interferes with the emission color of the CSP emitting device, and reduces the luminous efficiency of the emitting device.

SUMMARY

In view of the above problems, an object of the present disclosure is to provide an LED package structure and a manufacturing method for same, solving the problem that the blue light leaking from a bottom surface of the LED chip interferes with the emission color of the CSP emitting device, and reduces the luminous efficiency of the emitting device.

To achieve the above objective, the present disclosure provides an LED package structure, including:

a chip scale package (CSP) light emitting element, where the CSP light emitting element includes a light emitting chip, the light emitting chip includes an electrode group located on a bottom surface of the light emitting chip; and a shading layer, where the shading layer is disposed on a bottom surface or a side surface of the CSP light emitting element, or the shading layer is disposed on the bottom surface and the side surface of the CSP light emitting element Preferably, the CSP light emitting element further includes:

a surrounding structure enclosing the side surface of the light emitting chip; and a wavelength conversion layer being disposed on an upper surface of the light emitting chip and the surrounding structure, where an arc-shaped structure is formed on an interface between the wavelength conversion layer and the surrounding structure.

Preferably, one end of the arc-shaped structure is substantially coplanar with a top surface of the wavelength conversion layer, and the other end extends to an outer edge of the upper surface of the light emitting chip.

Preferably, one end of the arc-shaped structure is substantially coplanar with a top surface of the wavelength conversion layer, and the other end extends to the side surface of the light emitting chip.

Preferably, the arc-shaped structure is a convex surface curved upward, or the arc-shaped structure is a concave surface curved downward.

Preferably, the package structure further includes: a transparent package layer being disposed on the wavelength conversion layer, where a contact surface between the wavelength conversion layer and the transparent package layer is an arc-shaped surface protruding upwardly or recessing downwardly.

Preferably, diffuser are dispersed in the transparent package layer.

Preferably, the shading layer is disposed on the bottom surface of the light emitting chip.

Preferably, the shading layer is disposed on the electrode group.

Preferably, the CSP light emitting element includes a surrounding structure enclosing the side surface of the light emitting chip, where the shading layer is disposed on the bottom surface or at least a portion of the side surface of the surrounding structure, or the shading layer is disposed on the bottom surface and at least a portion of the side surface of the surrounding structure.

Preferably, the CSP light emitting element includes a wavelength conversion layer, where a side surface of the shading layer and a side surface of the wavelength conversion layer are substantially coplanar.

Preferably, the CSP light emitting element includes a wavelength conversion layer, where the shading layer is disposed on a side surface of the wavelength conversion layer.

Preferably, the CSP light emitting element includes a surrounding structure enclosing the side surface of the light emitting chip; and a wavelength conversion layer, where the shading layer is disposed on a side surface of the wavelength conversion layer, and a side surface and a bottom surface of the surrounding structure.

Preferably, the wavelength conversion layer is a fluorescent resin layer, a fluorescent sheet or a combination of a fluorescent film and a transparent resin.

Preferably, a material of the surrounding structure is a silicone or epoxy based material mixed with one or a combination of titanium dioxide, silicon dioxide, zirconium oxide and boron nitride.

Preferably, the shading layer is made of a metal material, an opaque insulation material, an insulation material with low light transmittance, an insulation resin, an insulation varnish or a ceramic material with low light transmittance.

The present disclosure also provides an LED package structure, including:
a light emitting chip having a side surface, an upper surface and a bottom surface, where the bottom surface is disposed with an electrode group;
a surrounding structure enclosing the side surface of the light emitting chip; and
a wavelength conversion layer being disposed on the upper surface of the light emitting chip and the surrounding structure, where an arc-shaped structure is formed on an interface between the wavelength conversion layer and the surrounding structure.

The disclosure also provides an LED package structure, including:
a light emitting chip having a side surface, an upper surface and a bottom surface, where the bottom surface is disposed with an electrode group;
a wavelength conversion layer being disposed on the side surface and the upper surface of the light emitting chip; and
a transparent package layer being disposed on a top surface of the wavelength conversion layer, where a contact surface between the wavelength conversion layer and the the wavelength conversion layer is an arc-shaped surface protruding upwardly or recessing downwardly.

The disclosure also provides a method for manufacturing an LED package structure, the method including:
providing a support plate with a removable layer;
placing a chip scale package (CSP) light emitting element on the removable layer, where a light emitting surface of the CSP light emitting element faces toward the removable layer, and an electrode group of the CSP light emitting element is away from the removable layer;
forming a photoresist pattern at a gap within the electrode group;
disposing a shading layer to overlay a side of the CSP light emitting element on which the electrode group is disposed and the electrode group;
removing the photoresist pattern, the removable layer, and the support plate to obtain the LED package structure.

The disclosure also provides a method for manufacturing an LED package structure, the method including:
providing a support plate with a removable layer;
placing a chip scale package CSP light emitting element on the removable layer, where a light emitting surface of the CSP light emitting element faces toward the removable layer, and an electrode group of the CSP light emitting element is away from the removable layer;
disposing a photoresist pattern to overlay a gap within the electrode group and a bottom surface of the electrode group;
disposing a shading layer to overlay a side of the CSP light emitting element on which the electrode group is disposed;
removing the photoresist pattern, the removable layer, and the support plate to obtain the LED package structure.

The disclosure also provides a method for manufacturing an LED package structure, the method including:
providing a support plate with a removable layer, and forming a first shading layer of an insulation material on the removable layer;
arranging a light emitting chip on the first shading layer, where an electrode group of the light emitting chip is placed in the first shading layer and extends to the removable layer;
disposing a surrounding structure on the first shading layer, where the surrounding structure is disposed on a side surface of the light emitting chip;
disposing a wavelength conversion layer to overlay a top surface of the surrounding structure and an upper surface of the light emitting chip; and
removing the removable layer and the support plate to obtain the LED package structure.

The disclosure also provides a method for manufacturing an LED package structure, the method including:
providing a support plate with a removable layer,
arranging a light emitting chip on the removable layer;
disposing a first shading layer to overlay the removable layer;
disposing a surrounding structure on the first shading layer, where the surrounding structure is disposed on a side surface of the light emitting chip;
disposing a wavelength conversion layer to overlay a top surface of the surrounding structure and an upper surface of the light emitting chip; and
removing the removable layer and the support plate to obtain the LED package structure.

The disclosure also provides a method for manufacturing an LED package structure, the method including:
providing a support plate with a removable layer;
arranging a light emitting chip on the removable layer;
disposing a surrounding structure on the removable layer, where the surrounding structure surrounds a side surface of the light emitting chip;
disposing a wavelength conversion layer to overlay a top surface of the surrounding structure and an upper surface of the light emitting chip;
cutting a side surface of the surrounding structure and a side surface of the wavelength conversion layer;
disposing a shading layer to overlay the cut side surface of the surrounding structure and the side surface of the wavelength conversion layer; and
removing the removable layer and the support plate to obtain the LED package structure.

The disclosure also provides a method for manufacturing an LED package structure, comprising:
providing a support plate with a removable layer;
arranging a light emitting chip on the removable layer;
disposing a surrounding structure on the removable layer, wherein the surrounding structure is disposed on a side surface of the light emitting chip;
cutting a side surface of the surrounding structure;
disposing the shading layer to overlay the cut side surface of the surrounding structure;
disposing a wavelength conversion layer to overlay a top surface of the shading layer, a top surface of the surrounding structure and an upper surface of the light emitting chip:
removing the removable layer and the support plate to obtain the LCD package structure.

The disclosure also provides a method for manufacturing an LED package structure comprising:
providing a support plate with a removable layer;
arranging a light emitting chip on the removable layer;
disposing a surrounding structure on the removable layer, wherein the surrounding structure is disposed on a side surface of the light emitting chip;
disposing a wavelength conversion layer to overlay a top surface of the surrounding structure and an upper surface of the light emitting chip;
heating the support plate, and rearranging the light emitting chip, the surrounding structure and the wavelength conversion layer on the removable layer after flipping same, wherein the wavelength conversion layer is in contact with the removable layer, and an electrode group of the light emitting chip is away from the removable layer;

cutting the side surface of the surrounding structure and forming a step on the side surface of the surrounding structure;

disposing a shading layer on the step of the surrounding structure, wherein the shading layer is substantially coplanar with a bottom surface of the surrounding structure;

removing the removable layer and the support plate to obtain the LED package structure.

The LED package structure according to the present disclosure includes a shading layer, where the shading layer is disposed on a bottom surface and/or a side surface of the CSP light emitting element. When a bottom surface of the CSP light emitting element is overlaid with a shading layer, light from the CSP light emitting element will not leak from the bottom surface of the CSP light emitting element under a covering of the shading layer, as a result, light leakage from the bottom surface of the CSP light emitting element is avoided, thereby the luminous efficiency of the LED chip is improved. When the side surface of the CSP light emitting element is overlaid with the shading layer, light leakage from the side surface of the CSP light emitting element is avoided. Meanwhile, even if there is light leakage from the bottom surface of the CSP light emitting element, the shading layer may block the leaked light, such that the light leaking from the bottom surface of the CSP light emitting element is less likely to interfere with the emission color of the light emitting element. Accordingly, an LED package structure is provided by the present disclosure, solving a problem that the blue light leaking from the bottom surface of the LED chip interferes with the emission color of the CSP emitting device, thereby reducing the luminous efficiency of the emitting device.

For easy understanding of the above objectives, technical features and advantages, detailed description will be set forth below in conjunction with the accompanying drawings.

BRIEF DESCRIPTION OF DRAWINGS

In order to clearly illustrate technical solutions of the embodiments according to the present disclosure or of the prior art, a brief description of the drawings used in the descriptions of the embodiments or the prior art will be made below. The drawings in the following description are certain embodiments of the present disclosure. It is apparent that, for those skilled in the art, other drawings may be obtained based on these drawings without any creative efforts.

| Description of reference signs: | | | |
|---|---|---|---|
| 100-1300 | LED package structure | 110 | Light emitting chip |
| 112 | First electrode | 114 | Second electrode |
| 120, 120a | Surrounding structure | 130, 130a | Wavelength conversion layer |
| 140-1540 | Shading layer | 150 | Transparent package layer |
| 1420 | Removable layer | 1410 | Support plate |
| 1430, 1530 | Photoresist pattern | 1640 | First shading layer |
| 1642 | Second shading layer | 131 | Arc-shaped surface |
| 121 | Arc-shaped structure | | |

DESCRIPTION OF EMBODIMENTS

To provide a clear understanding of the objective, technical solution and advantage of embodiments of the present disclosure, descriptions of technical solutions in the embodiments are thoroughly set forth below with reference to the accompanying drawings. It should be understood that the embodiments discussed herein are only a part of embodiments of the present disclosure, and are not all of the embodiments thereof. Other embodiments obtained by those skilled in the art based on the embodiments of the present disclosure without creative efforts fall within the scope of the present disclosure.

Embodiment 1

FIGS. 1-13 are schematic structural diagrams illustrating different structures of an LED package structure according to Embodiment 1 of the present disclosure.

Figure 1:
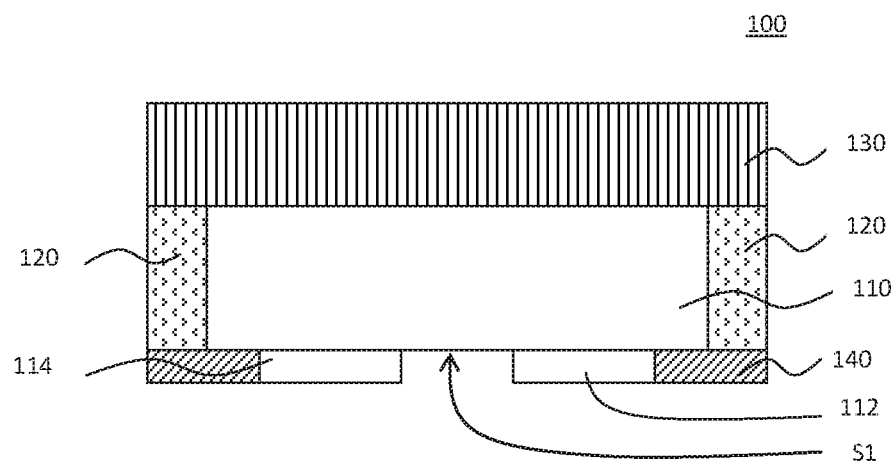
FIGS. 1-13 are schematic structural diagrams illustrating different structures of an LED package structure according to Embodiment 1 of the present disclosure.

As shown in FIG. 1, in the present embodiment, an LED package structure 100 includes: a chip scale package (CSP) light emitting element, where the CSP light emitting element includes a light emitting chip 110 (specifically, an LED chip), and the light emitting chip 110 includes an electrode group located on a bottom surface of the light emitting chip 110; and a shading layer 140, the shading layer 140 is disposed on a bottom surface or a side surface of the CSP light emitting element. In other words, in the present embodiment, the shading layer 140 may is disposed on the bottom surface of the CSP light emitting element, or the side surface of the CSP light emitting element; additionally, in the present embodiment, the shading layer 140 may overlay both of the bottom surface and the side surface of the CSP light emitting element. When the shading layer 140 is disposed on the bottom surface of the CSP light emitting, element, light emitted from the CSP light emitting element will not leak from the bottom surface of the CSP light emitting element due to a covering of the shading layer 140, as a result, light leakage from the bottom surface of the CSP light emitting element is avoided, thereby the luminous efficiency of the LED chip is improved. When the shading layer 140 is disposed on the side surface of the CSP light emitting element, even if there is light leakage from the bottom surface of the CSP light emitting element, the shading layer 140 may block the leaked light, such that the light leaking from the bottom surface of the CSP light emitting element is less likely to interfere with the emission color of the light emitting element, and at the same time, when the shading layer 140 is disposed on the side surface of the CSP light emitting element, it is also possible to avoid light leakage from the side surface of the CSP light emitting element.

As shown in FIG. 1, the CSP light emitting element further includes: a surrounding structure 120 and a wavelength conversion layer 130, where the light emitting chip 110 has an upper surface, a side surface and a bottom surface S1, where the bottom surface S1 of the light emitting, chip 110 is provided with an electrode group. The electrode group includes a first electrode 112 and a second electrode 114. The light emitting chip 110 may be, for example, a flip chip LED chip. The surrounding structure 120 encompasses the side surface of the light emitting chip 110 and the wavelength conversion layer 130 is disposed on the upper surface of the light emitting chip 110 and a top surface of the surrounding structure 120. In the present embodiment, the shading layer 140 is disposed on the bottom surface S1 of the light emitting chip 110, and specifically, the shading layer 140 is located on the bottom surface S1 on both sides of the first electrode 112 and the second electrode 114. The bottom surface S1 between the first electrode 112 and the second electrode 114 is not overlaid with the shading layer 140.

In this embodiment, the shading layer 140 may be, for example, a metal material, an opaque insulation material, an insulation material with low light transmittance, an insulation resin, an insulation varnish or a ceramic material with low light transmittance, which is not limited herein. As shown in FIG. 1, the shading layer 140 is further disposed on a surface of the surrounding structure 120 away from the wavelength conversion layer 130, that is, the shading layer 140 is disposed on both of the bottom surface of the light emitting chip 110 and the bottom surface of the surrounding structure 120, where the thickness of the shading layer 140 may be, for example, equal to or smaller than the thickness of the first electrode 112 and the second electrode 114.

In this embodiment, the material of the surrounding structure 120 is a silicone or epoxy based material mixed with one or a combination of titanium dioxide, silicon dioxide, zirconium oxide and boron nitride, which is not limited herein. The wavelength conversion layer 130 includes a wavelength conversion material, where the wavelength conversion layer 130 may be, for example, a mixed layer formed of fluorescent powders and a transparent resin (i.e., a transparent resin mixed with fluorescent powders), where the material of the fluorescent powder may be, for example, aluminate garnet series, silicate series, nitride series, phosphate series, sulfide series, scandate, or the like, which is not limited herein. The material of the above transparent resin may be, for example, silicone or epoxy. In addition, in other embodiments, the wavelength conversion layer 130 may be, for example, a superimposed combination of a fluorescent layer and a transparent resin layer, or may be a superimposed layer or a mixed layer of a fluorescent sheet or a fluorescent film together with a transparent resin. Further, in other embodiments, the material of the wavelength conversion layer may also include at least one of or a combination of fluorescent powders, a transparent resin, and diffuser.

Figure 2:
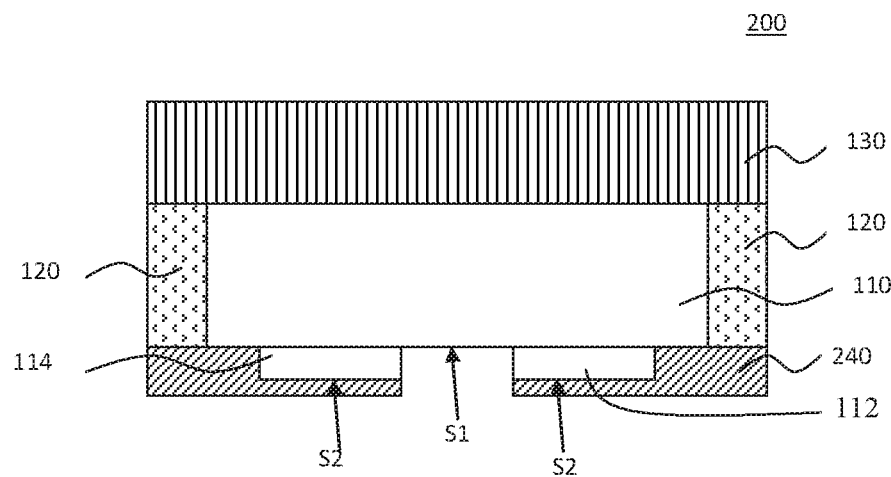

Further, as shown in FIG. 2, an LED package structure 200 of the present disclosure includes the light emitting chip 110, the surrounding structure 120, the wavelength conversion layer 130 and a shading layer 240, where the shading layer 240 may be made of, for example, a metal material. Compared with the shading layer 140 of the LED package structure 100, different from the LED package structure 100, the shading layer 240 of the LED package structure 200 is disposed not only on the bottom surface S1 of the light emitting chip 110, but also on surfaces S2 of the first electrode 112 and the second electrode 114. It should be noted that the bottom surface S1 between the first electrode 112 and the second electrode 114 is not provided with the shading layer 240, in order to avoid short circuit accidents. The description of the same components in the LED package structure 200 and the LED package structure 100 will not be repeated herein.

Figure 3:
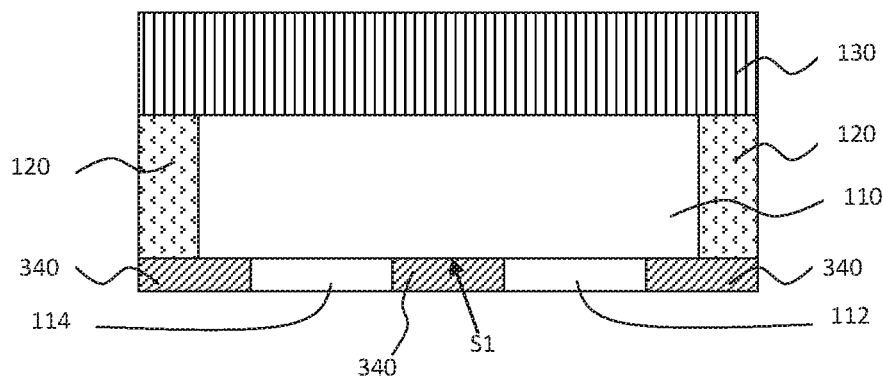

Further, referring to FIG. 3, an LED package structure 300 of the present disclosure includes the light emitting chip 110, the surrounding structure 120, the wavelength conversion layer 130 and a shading layer 340, where the shading layer 340 may be, for example, an opaque insulation material. Compared with the shading layer 140 of the LED package structure 100, different from the LED package structure 100, the shading layer 340 of the LED package structure 300 is disposed not only outside the two electrodes of the light emitting chip 110, hut also between the two electrodes. The material of the shading layer 340 may be an insulation material with low light transmittance or an opaque insulation material, such as a resin with low light transmittance, an insulation resin, an insulation varnish or a ceramic material with low light transmittance, which is not limited herein.

Figure 4:
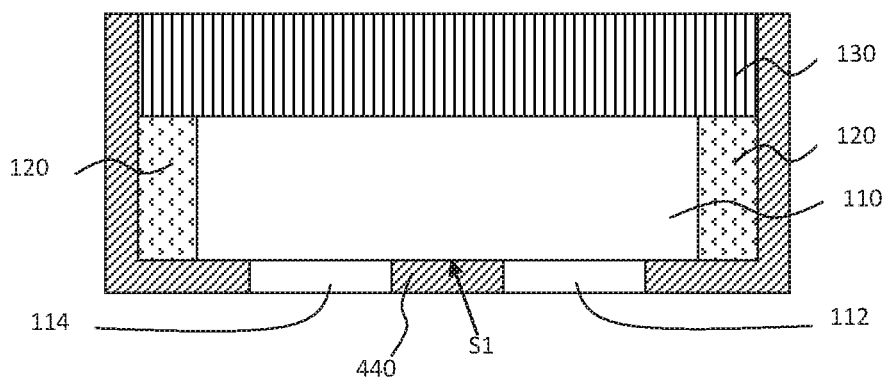

Further, referring to FIG. 4, the LED package structure 400 of the present disclosure includes the light emitting chip 110, the surrounding structure 120, the wavelength conversion layer 130 and a shading layer 440, where the shading layer 440 may be, for example, an opaque insulation material. Compared with the shading layer 340 of the LED package structure 300, the shading layer 440 of the LED package structure 400 further encompasses side surfaces of the wavelength conversion layer 130 and the surrounding structure 120 in addition to the position of the shading layer 340 in FIG. 3. That is, the shading layer 440 is disposed on the side surface of the wavelength conversion layer 130 and the surrounding structure 120, and a bottom surface of the light emitting chip 110 and the surrounding structure 120. The shading layer 440 may be made of an insulation material with low light transmittance or an opaque insulation material, such as a resin with low light transmittance, an insulation resin, an insulation varnish or a ceramic material with low light transmittance, which is not limited herein. The description of the same components of the LED package structure 400 and the LED package structure 300 will not be repeated herein.

Figure 5:
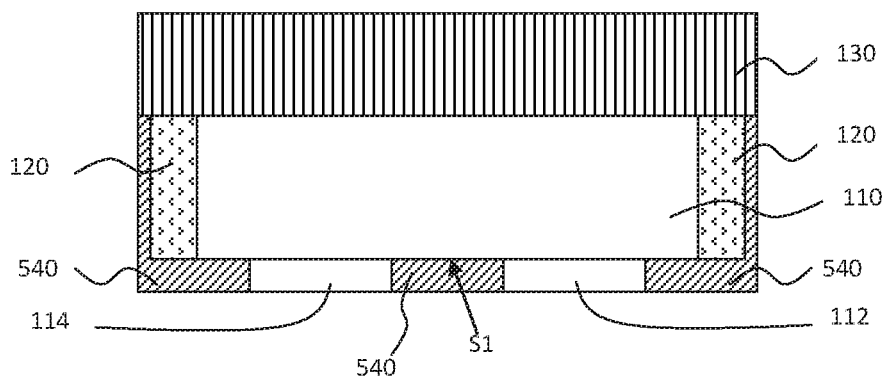

Further, referring to FIG. 5, the LED package structure 500 of the present disclosure includes the light emitting chip 110, the surrounding structure 120, the wavelength conversion layer 130 and a shading layer 540, where the shading layer 540 may be made of an insulation material with low light transmittance or an opaque insulation material, such as a resin with low light transmittance, an insulation resin, an insulation varnish or a ceramic material with low light transmittance. Compared with the shading layer 340 of the LED package structure 300, the shading layer 540 of the LED package structure 500 further encompasses a side surface of the surrounding structure 120 in addition to the position of the shading layer 340 in FIG. 3. Additionally, the shading layer 540 encompassing the side surface of the surrounding structure 120 and the wavelength conversion layer 130 may be designed to be substantially coplanar. The description of the same components of the LED package structure 500 and the LED package structure 300 will not be repeated herein.

Figure 6:
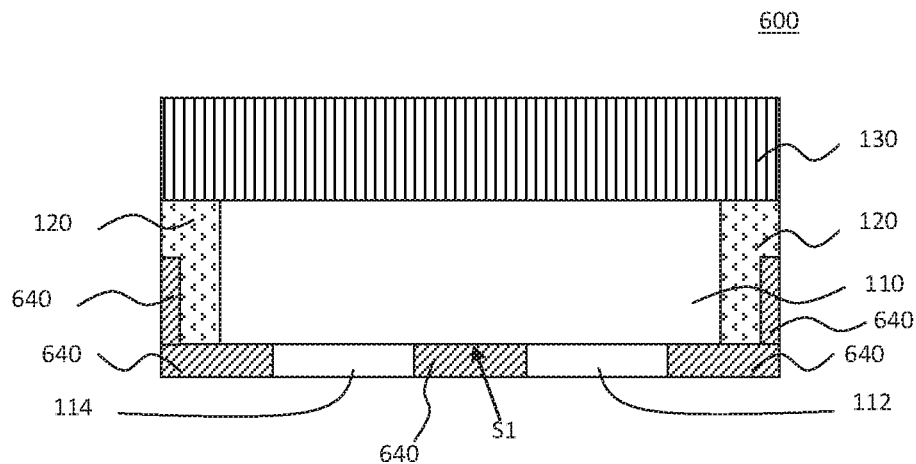

Further, referring to FIG. 6, the LED package structure 600 of the present disclosure includes the light emitting chip 110, the surrounding structure 120, the wavelength conversion layer 130 and a shading layer 640, where the shading layer 640 may be made of an insulation material with low light transmittance or an opaque insulation material, such as a resin with low light transmittance, an insulation resin, an insulation varnish or a ceramic material with low light transmittance. Compared with the shading layer 340 of the LED package structure 300, in addition to the position of the shading layer 340 as in FIG. 3, the shading layer 640 of the LED package structure 600 further partially encompasses an outer surface of the surrounding structure 120, that is, the shading layer 640 does not completely overlay a side surface of the surrounding structure 120. Side surfaces of the shading layer 640 partially encompassing the outer surface of the surrounding structure 120, the surrounding structure 120 and the wavelength conversion layer 130 may be designed to be substantially coplanar. The description of the same components of the LED package structure 600 and the LED package structure 300 will not be repeated herein.

Figure 7:
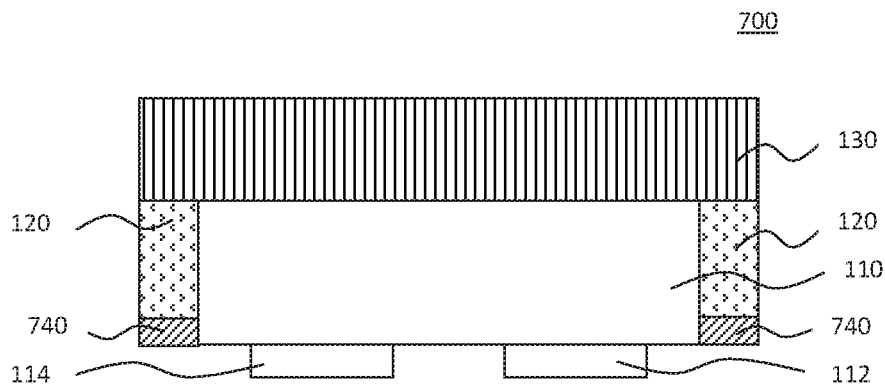

Further, referring to FIG. 7, the LED package structure 700 of the present disclosure includes the light emitting chip 110, the surrounding structure 120, the wavelength conversion layer 130 and a shading layer 740, where the shading layer 740 may be made of an insulation material with low light transmittance, an opaque insulation material or a metal material, such as a resin with low light transmittance, an insulation resin, an insulation varnish or a ceramic material with low light transmittance. The shading layer 740 may be disposed, for example, on a side surface of the light emitting chip 110 and on the bottom of the surrounding structure 120, and encompass the side surface of the light emitting chip 110 together with the surrounding structure 120.

Figure 8:
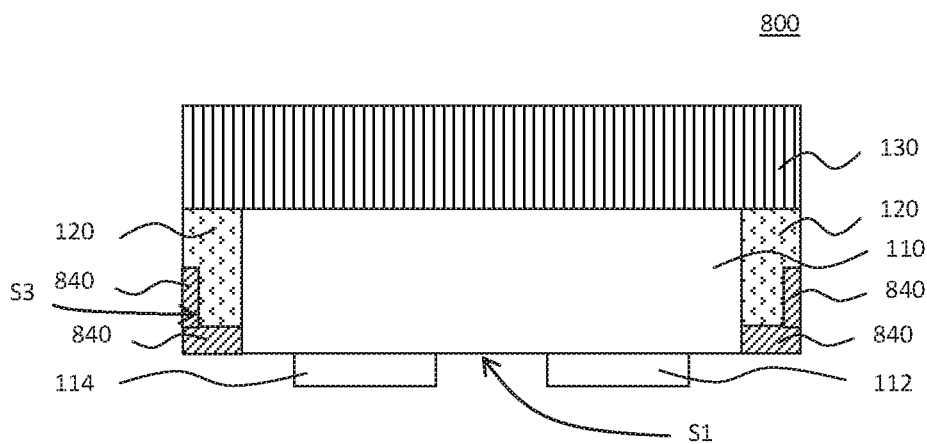
Figure 9:
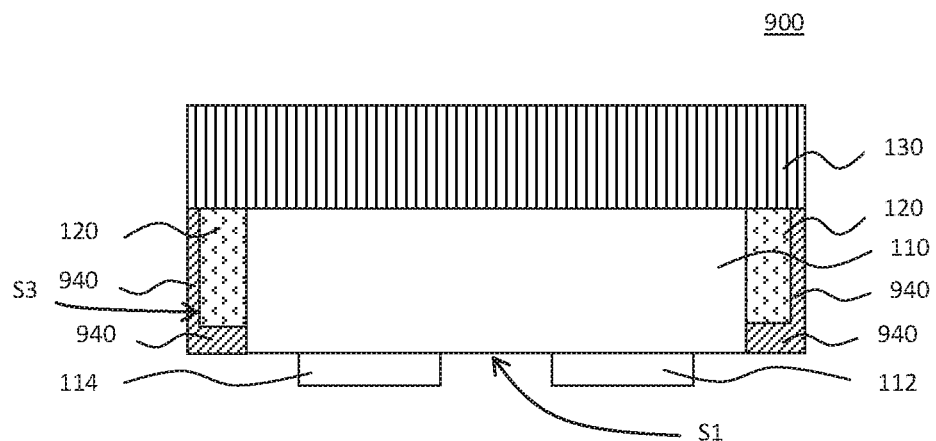
Figure 10:
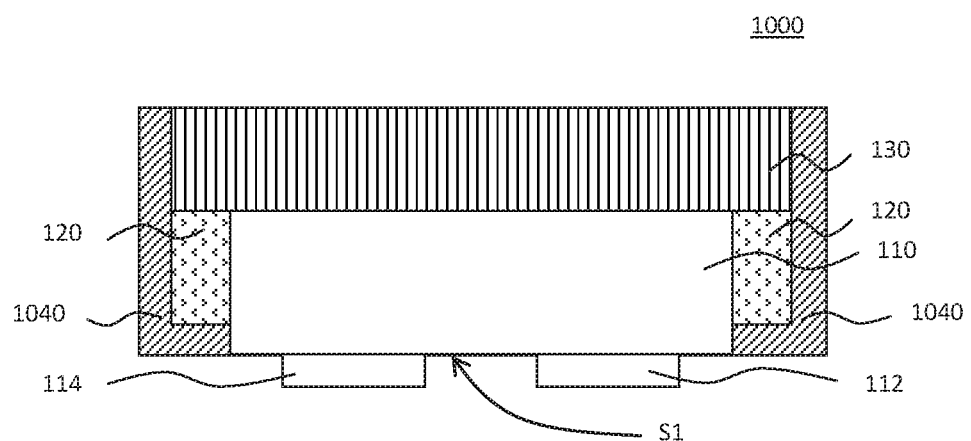

Further, referring to FIG. 8 to FIG. 10, the shading layer 840 of the present disclosure may be disposed on a portion of a side surface S3 of the surrounding structure 120, in addition to being disposed on the bottom of the surrounding structure 120 as the shading layer 740. However, a bottom surface S1 of the light emitting chip 110 is not overlaid with the shading layer 840. In FIG. 9, a disposing of the shading layer 940 includes, in addition to a bottom surface of the surrounding structure 120, an entire outer side surface S3 of the surrounding structure 120, where a shading layer disposed on the bottom of the surrounding structure 120 and a shading layer disposed on the side surface S3 are connected to each other. In FIG. 10, a disposing of a shading layer 1040 includes, for example, in addition to the bottom of the surrounding structure 120, side surfaces of both of the surrounding structure 120 and the wavelength conversion layer 130, as shown by the shading layer 1040 of FIG. 10.

Figure 11:
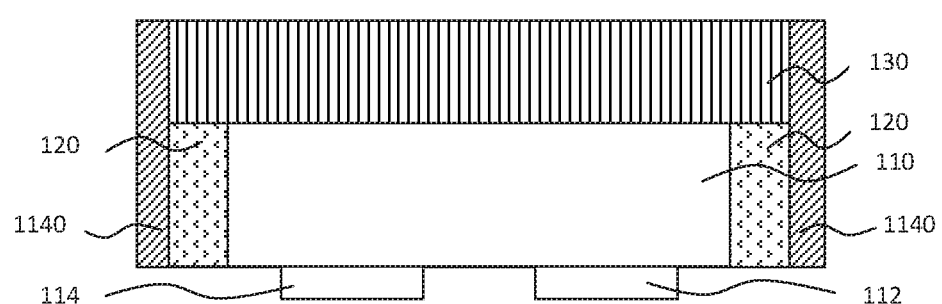
Figure 12:
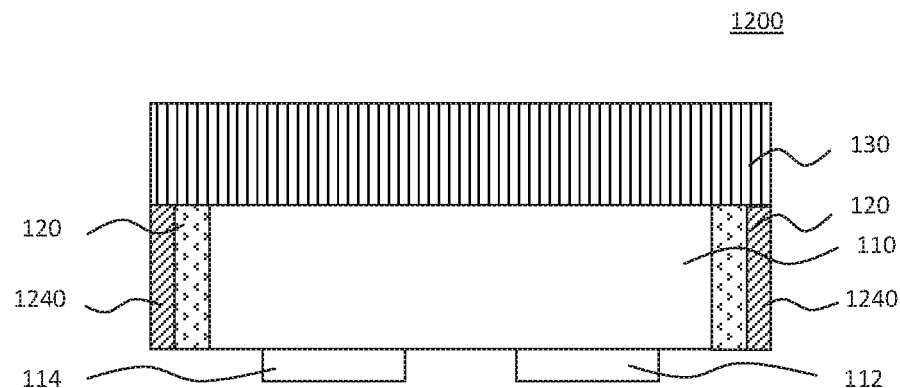
Figure 13:
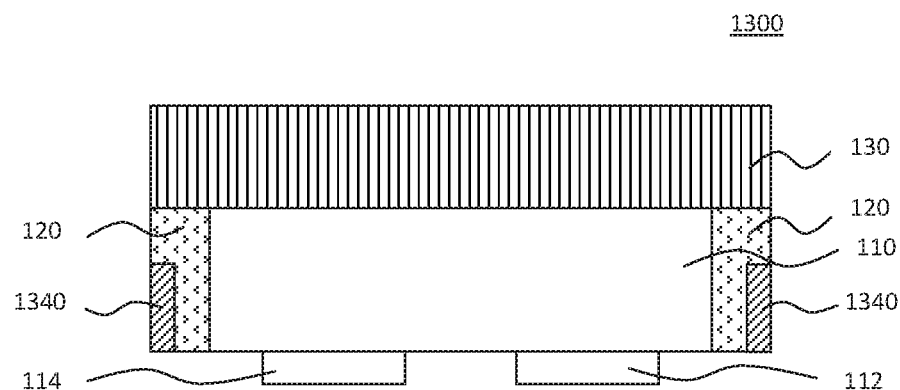

Further, referring to FIGS. 11-13, in other embodiments, the shading layer 1140 of the present disclosure may, for example, encompass only a side surface of the wavelength conversion layer 130 and the surrounding structure 120, as shown in FIG. 11. Alternatively, in other embodiments, as shown in FIG. 12, a shading layer 1240 may only encompass a side surface of the surrounding structure 120, where, for example, the shading layer 1240 and the wavelength converting layer 130 may be substantially coplanar or not coplanar. Alternatively, in other embodiments, as shown in FIG. 13, a shading layer 1340 may only encompass a portion of the outer side surface of the surrounding structure 120, where, for example, the shading layer 1340 and, the wavelength conversion layer 130 and the side surface of the surrounding the structure 120 may be substantially coplanar or not coplanar.

In the present disclosure, as shown in FIG. 1 to FIG. 13, the shading layer is disposed at locations, such as the bottom surface of the light emitting chip 110, the bottom surface of the surrounding structure 120; the side surface of the surrounding structure 120, and the side surface 130 of the wavelength conversion layer, such that light emitted from the LED chip can be prevented from leaking from the light emitting chip 110, the surrounding structure 120 or the wavelength conversion layer 130, etc., thereby improving the luminous efficiency of the LED chip.

Further, as shown in FIGS. 14A-14D; in the embodiment, an arc-shaped structure is formed on an interface between the wavelength conversion layer 130 and the surrounding structure 120, such that a LED package structure may be formed into a chip scale package structure with a reflective cup. A direction of light may be changed under the reflective effect caused by the arc-shaped structure 121.

Figure 14A:
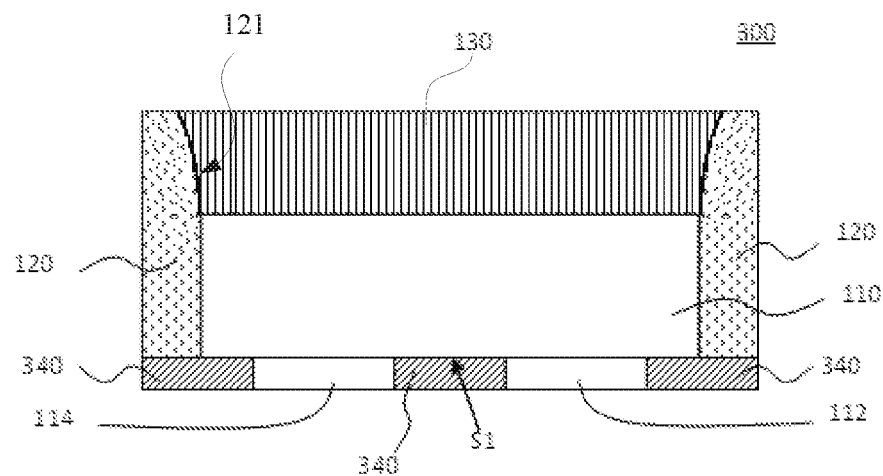
FIGS. 14A-14D are other schematic structural diagrams of an LED package structure according to Embodiment 1 of the present disclosure.
Figure 14B:
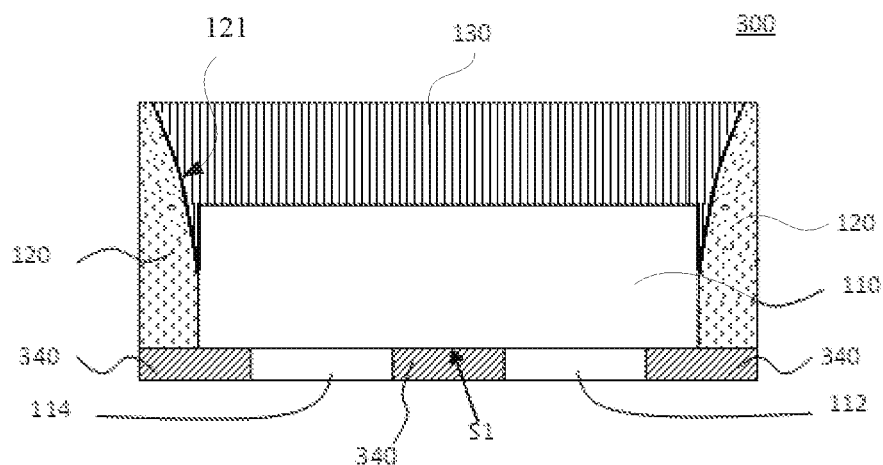
Figure 14C:
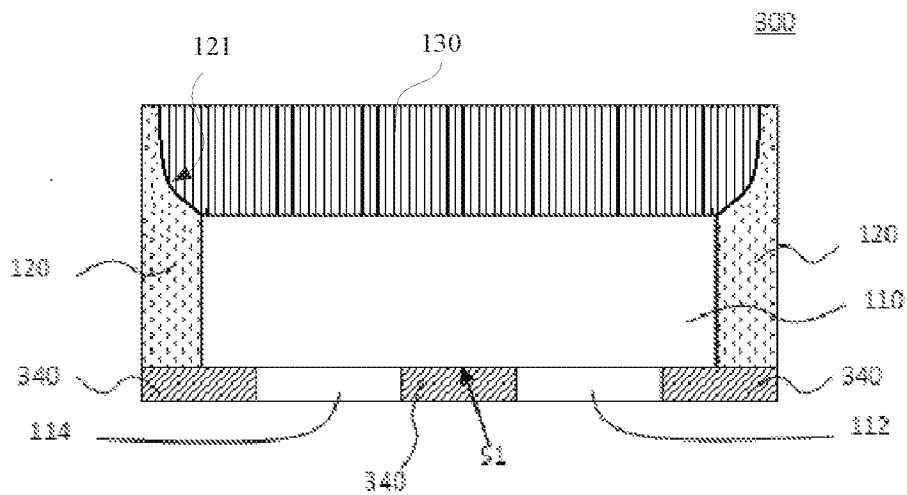
Figure 14D:
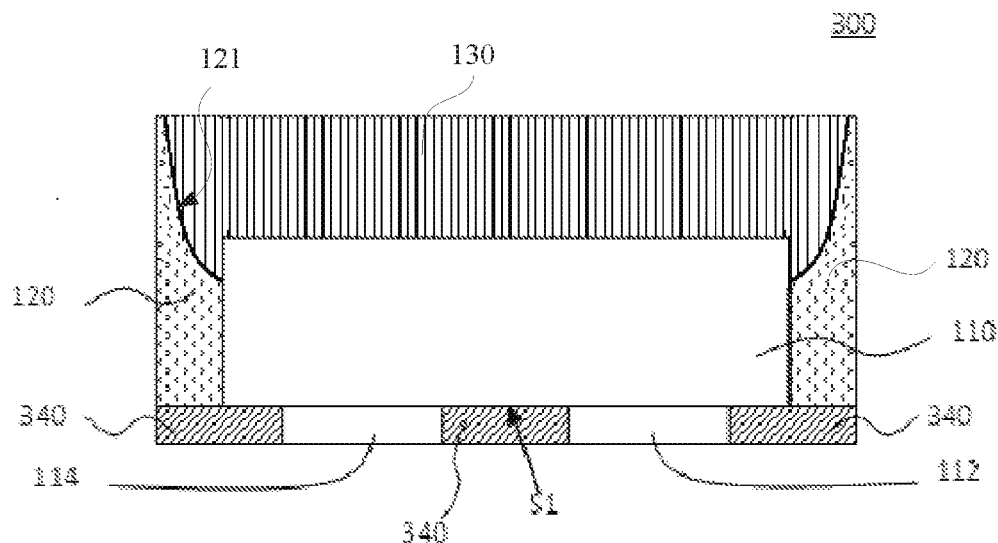

In this embodiment, as shown in FIG. 14A, the arc-shaped structure is a convex surface curved toward a wavelength conversion layer. At the same time, one end of the arc-shaped structure 121 is substantially coplanar with a top surface of the wavelength conversion layer 130, and the other end extends to an outer edge of the upper surface of the light emitting chip. As shown in FIG. 14B, one end of the arc-shaped structure 121 is substantially coplanar with a top surface of the wavelength conversion layer 130, and the other end extends to the side surface of the light emitting chip 110; that is, in this embodiment, the wavelength conversion layer 130 is disposed on both of the upper surface and the side surface of the light emitting chip 110 at the same time. As shown in FIG. 14C, the arc-shaped structure 121 is a concave surface curved downward, while one end of the arc-shaped structure 121 is substantially coplanar with a top surface of the wavelength conversion layer 130, and the other end extends to an outer edge of the upper surface of the light emitting chip 110. As shown in FIG. 14D, the arc-shaped structure 121 is a concave surface curved downward, where one end of the arc-shaped structure 121 is substantially coplanar with a top surface of the wavelength conversion layer 130, and the other end extends to the side surface of the light emitting chip 110; that is, the wavelength conversion layer 130 is disposed on both of the upper surface and the side surface of the light emitting chip 110 at the same time.

Figure 15A:
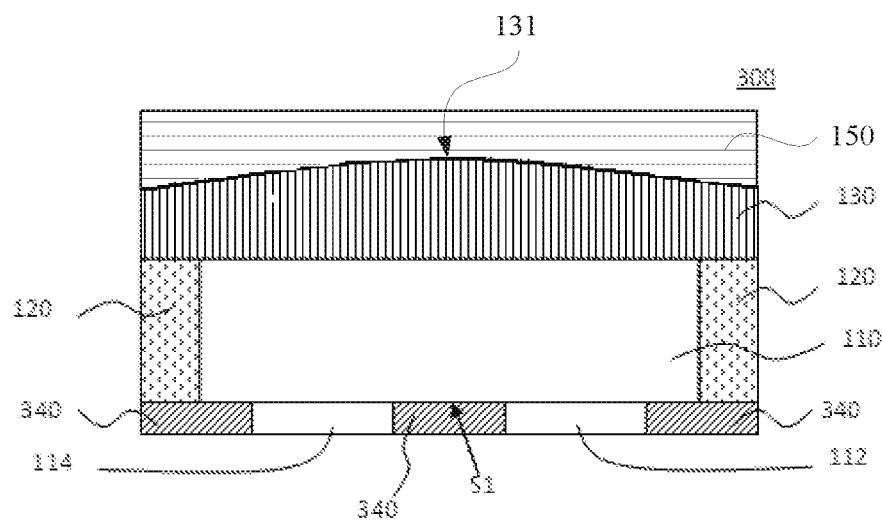
FIGS. 15A-15B are yet other schematic structural diagrams of an LED package structure according to Embodiment 1 of the present disclosure.
Figure 15B:
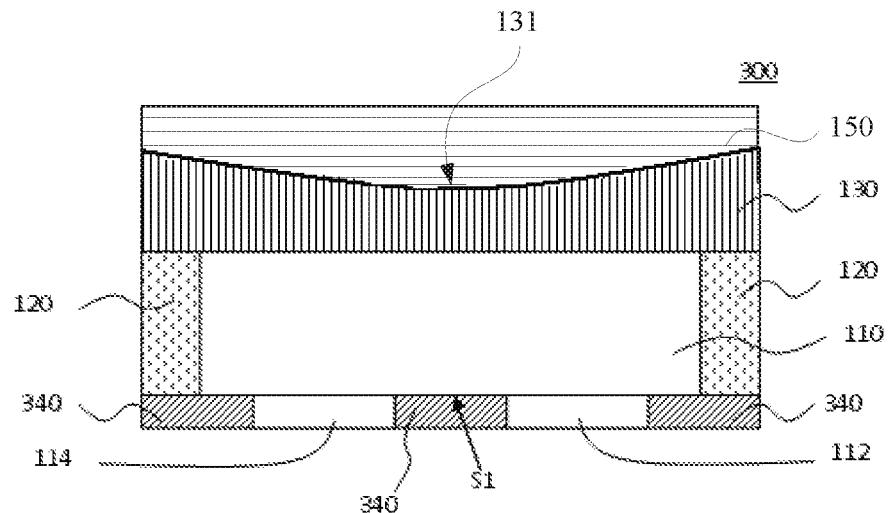

Further, referring to FIGS. 15A-15B, this embodiment further includes: a transparent package layer 150 is disposed on the wavelength conversion layer 130, where a contact surface between the wavelength conversion layer 130 and the transparent package layer 150 is an arc-shaped surface 131 protruding upwardly or recessing downwardly, such that the wavelength conversion layer 130 is overlaid with a layer of the transparent package layer 150 which is equivalent to a convex lens or concave lens. Diffuser may be dispersed in the transparent package layer 150, such that a light emitting angle of the wavelength conversion 130 may be changed, resulting in more uniform refraction of light when the light travels through diffusion layer. It is found through testing that, when the contact surface between the wavelength conversion layer 130 and the transparent package layer 150 is a convex surface, where the wavelength conversion layer 130 is not overlaid with the transparent package layer 150, luminance degradation of CSP with a large light emitting angle can be improved; however, CIEx and CIEy shift will shift downwardly due to unevenness of a cut surface. When the arc-shaped surface 131 as a contact surface between the wavelength conversion layer 130 and the transparent package layer 150 is a convex surface, and the wavelength conversion layer 130 is overlaid with the transparent package layer 150 which is dispersed with diffuser inside, it is found through testing that, after cutting five surfaces at the same time with evenness cut surfaces, both luminance degradation of CSP with a large light emitting angle as well as the downward shift of CIE shift can be improved.

Accordingly, in the present embodiment, when the contact surface between the wavelength conversion layer 130 and the transparent package layer 150 is an arc-shaped surface 131 protruding upwardly or recessing downwardly, where the transparent package layer 150 is dispersed with diffuser, the problem of luminous unevenness and a shifting of CIE color gamut along with an increasing angle when using an existing CSP light emitting device is solved.

Embodiment 2

FIGS. 16A-16H are schematic structural diagrams of an LED package structure according to Embodiment 2 of the present disclosure.

In the present embodiment, as shown in FIG. 16A to FIG. 16H, the LED package structure includes: a light emitting chip 110, a surrounding structure 120a and a wavelength conversion layer 130a, where the light emitting chip 110 has a side surface, an upper surface and a bottom surface. The bottom surface is provided with an electrode group, the electrode group includes a first electrode 112 and a second electrode 114. The surrounding structure 120a encloses the side surface of the light emitting chip 110, and the wavelength conversion layer 130a is disposed on the upper surface of the light emitting chip 110 and a portion of the surrounding structure 120a, where an arc-shaped structure 121 is formed on an interface between the wavelength conversion layer 130a and the surrounding structure 120a, such that the LED package structure may be formed into a chip scale package structure with a reflective cup. A direction of light may be changed under the reflective effect of the arc-shaped structure 121.

Figure 16A:
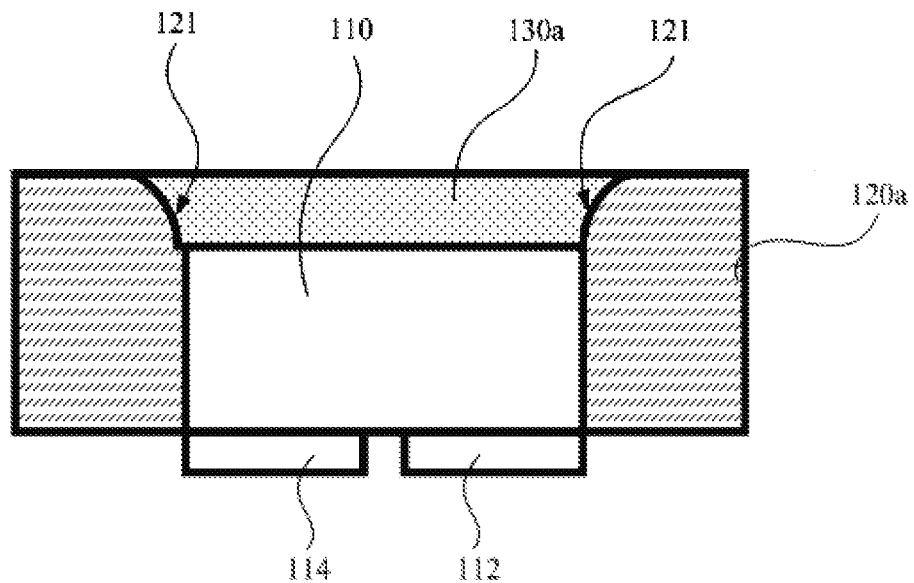
FIGS. 16A-16H are schematic structural diagrams of an LED package structure according to Embodiment 2 of the present disclosure.
Figure 16B:
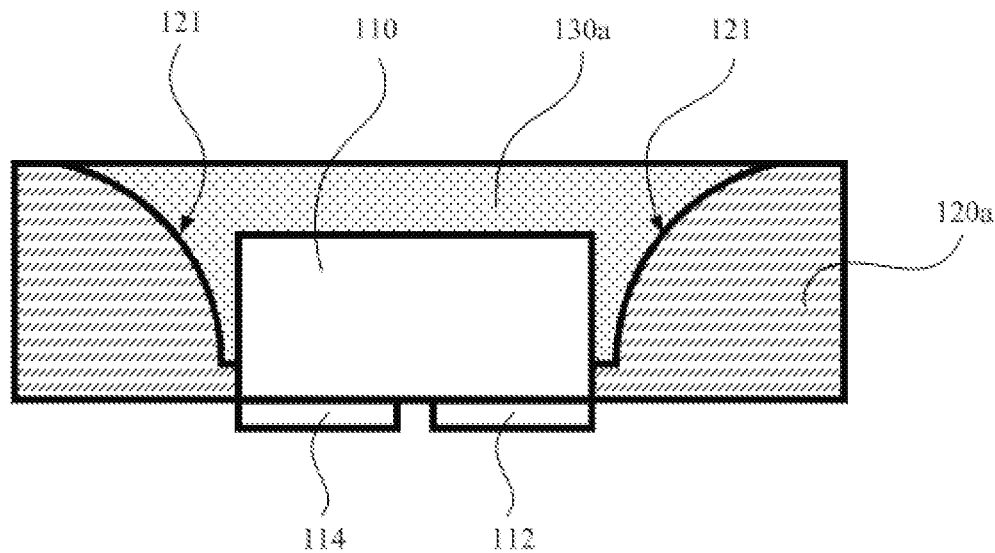
Figure 16C:
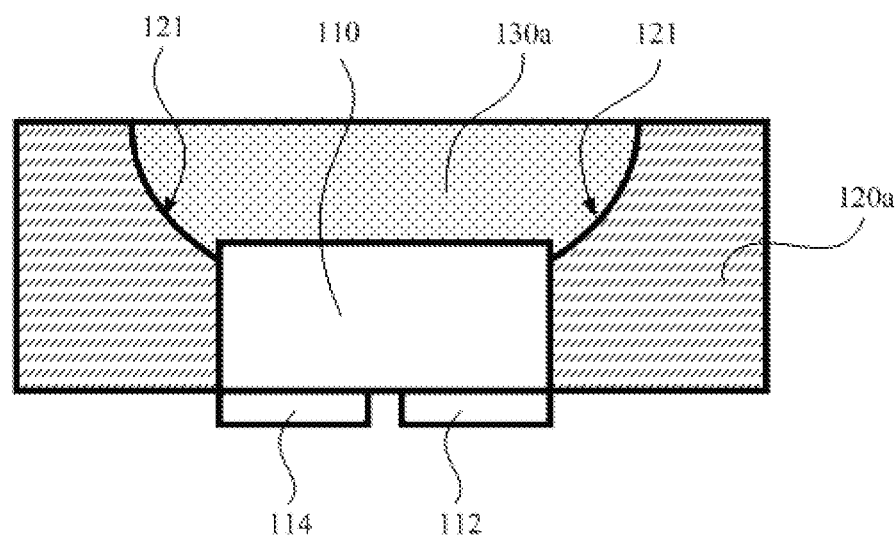
Figure 16D:
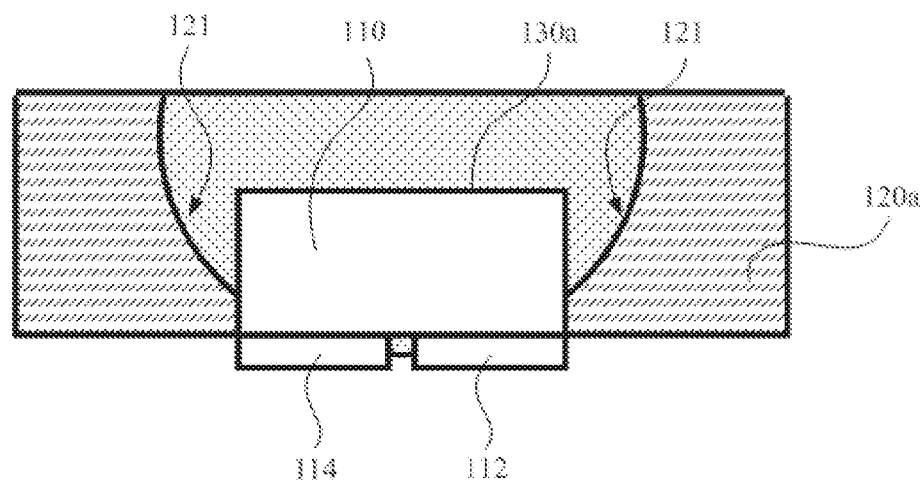

In this embodiment, as shown in FIG. 16A, the arc-shaped structure 121 is a convex surface curved upward. At the same time, one end of the arc-shaped structure 121 is substantially coplanar with a top surface of the wavelength conversion layer 130a, and the other end extends to an outer edge of the upper surface of the light emitting chip 110. As shown in FIG. 16B, one end of the arc-shaped structure 121 is substantially coplanar with a top surface of the wavelength conversion layer 130a, and the other end extends to the side surface of the light emitting chip 110; that is, in this embodiment, the wavelength conversion layer 130a is disposed on both of the upper surface and the side surface of the light emitting chip 110 at the same time. As shown in FIG. 16C, the arc-shaped structure 121 is a concave surface curved downward, while one end of the arc-shaped structure 121 is substantially coplanar with a top surface of the wavelength conversion layer 130a, and the other end extends to an outer edge of the upper surface of the light emitting chip 110. As shown in FIG. 16D, the arc-shaped structure 121 is a concave, where one end of the arc-shaped structure is substantially coplanar with a top surface of the wavelength conversion layer 130a, and the other end extends to the side surface of the light emitting chip 110; that is, the wavelength conversion layer 130a is disposed on both of the upper surface and the side surface of the light emitting chip 110 at the same time.

Figure 16E:
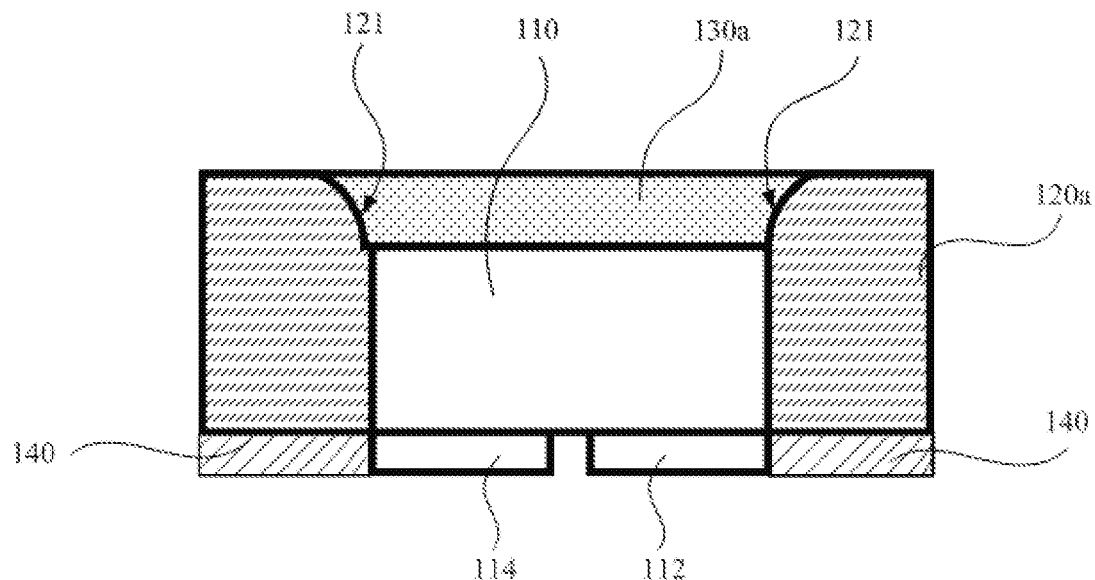

Further, as shown in FIG. 16E, a shading layer 140 is further included, where the shading layer 140 is disposed on the bottom surface or the side surface of the LED package structure provided in this embodiment, or the shading layer is disposed on the bottom surface and the side surface of the LED package structure.

Further, in this embodiment, the shading layer 140 may specifically overlay the bottom surface of the light emitting chip 110. Further, the shading layer 140 is disposed on the electrode group. Further, the shading layer 140 is disposed on the bottom surface or at least a portion of the side surface of the surrounding structure 120a; or the shading layer 140 is disposed on the bottom surface and at least a portion of the side surface of the surrounding structure 120a. Further, the side surface of the shading layer 140 and the side surface of the wavelength conversion layer are substantially coplanar. Further the shading layer 140 is disposed on the side surface of the wavelength conversion layer 130a. Further, the shading layer 140 is disposed on the side surface of the wavelength conversion layer 130a, and the side surface and the bottom surface of the surrounding structure 120a.

Figure 16F:
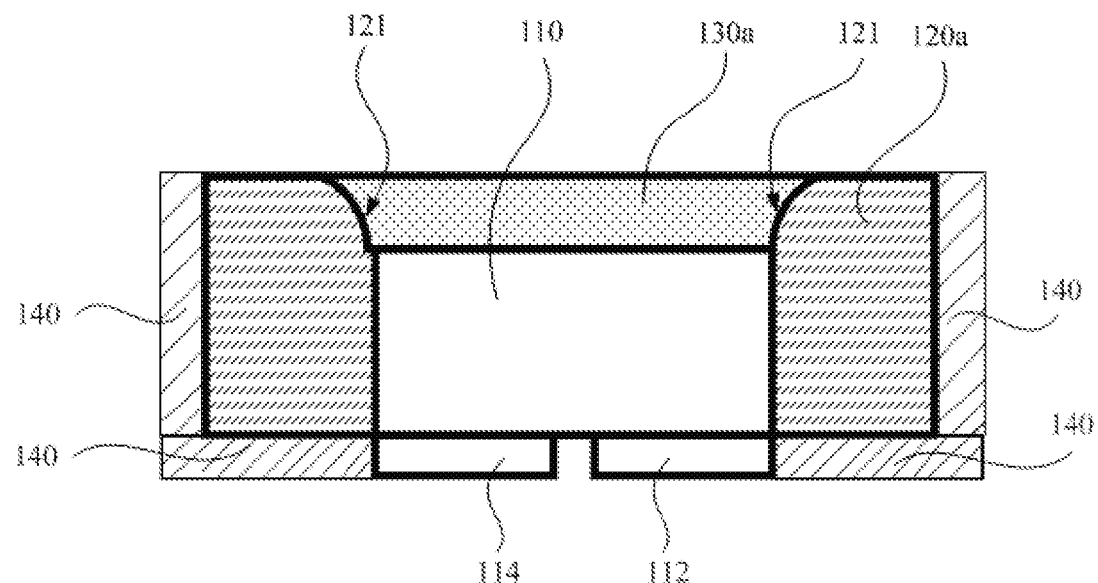

In this embodiment, it should be noted that the disposed position of the shading layer 140 includes, but not limited to, the position as shown in FIG. 16E to FIG. 16F, regarding specific disposed positions of the shading layer 140, reference may be made to FIG. 1 to FIG. 13 for details.

The shading layer may be made of a metal material, an opaque insulation material, an insulation material with low light transmittance, an insulation resin, an insulation varnish or a ceramic material with low light transmittance.

Figure 16G:
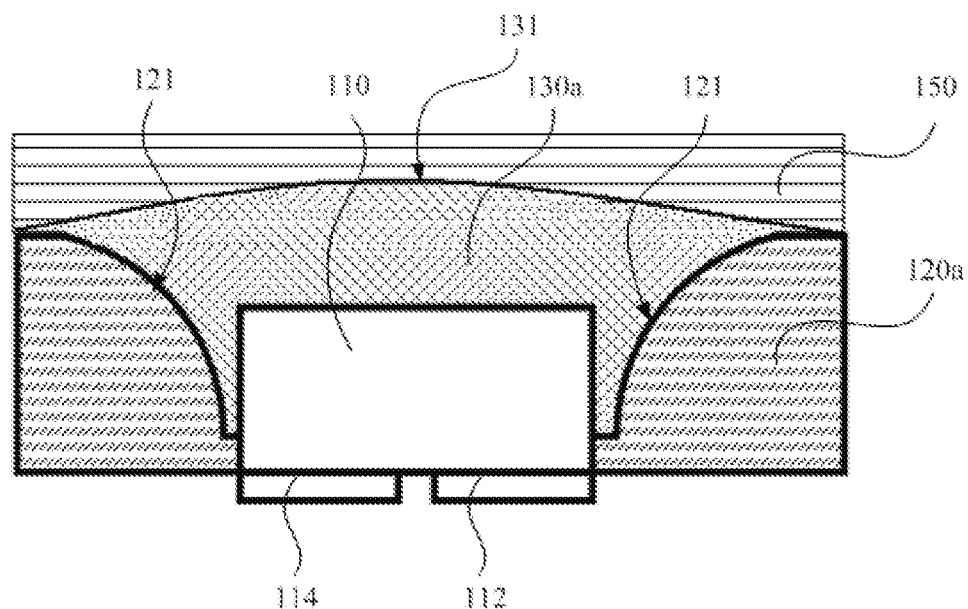
Figure 16H:
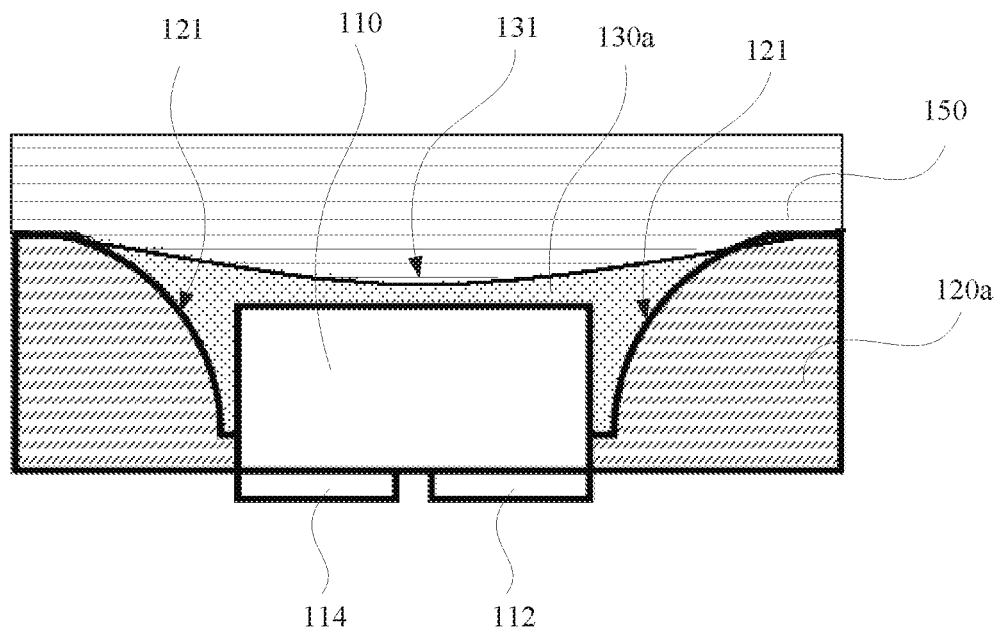

Further, referring to FIGS. 16G-16H, which further includes: a transparent package layer 150 being disposed on the top surface of the wavelength conversion layer 130a, where a contact surface between the wavelength conversion layer 130a and the transparent package layer 150 is an arc-shaped surface 131 protruding upwardly or recessing downwardly, preferably, the transparent package layer 150 is dispersed with diffuser, such that the wavelength conversion layer 130a is overlaid with a layer of the transparent package layer 150 which is equivalent to a convex lens or concave lens. The transparent package layer 150 is dispersed with diffuser, such that a light emitting angle of the wavelength conversion 130a may be chanced, resulting in more uniform refraction of light when the light travels through diffusion powder layer. It is found through testing that, when the contact surface between the wavelength conversion layer 130a and the transparent package layer 150 is a convex surface, where the wavelength conversion layer 130a is not overlaid with the transparent package layer 150, luminance degradation of CSP with a large light emitting angle can be improved; however, CIEx and CIEy shift will shift downwardly due to unevenness of a cut surface. When the arc-shaped surface 131 as a contact surface between the wavelength conversion layer 130a and the transparent package layer 150 is a convex surface, and the wavelength conversion layer 130a is overlaid with the transparent package layer 150 which is dispersed with diffuser inside, it is found through testing that, after cutting five surfaces at the same time with evenness cut surfaces, both luminance degradation of CSP with a large light emitting angle as well as the downward shift of CIE shift can be improved.

Accordingly, in the present embodiment, when the contact surface between the wavelength conversion layer 130s and the transparent package layer 150 is an arc-shaped surface 131 protruding upwardly or recessing downwardly, where the transparent package layer 150 is dispersed with diffuser, the problem of luminous unevenness and a shifting of CIE color gamut with an increasing angle when using an existing CSP light emitting device is solved.

In this embodiment, the wavelength conversion layer 130a may specifically be a fluorescent resin layer, or a combination of a fluorescent film and a transparent resin, and a material of the surrounding structure 120a may be a silicone or epoxy based material mixed with one or a combination of titanium dioxide, silicon dioxide, zirconium oxide and boron nitride.

Embodiment 3

FIGS. 17A-17D are schematic structural diagrams of an LED package structure according to Embodiment 3 of the present disclosure.

Figure 17A:
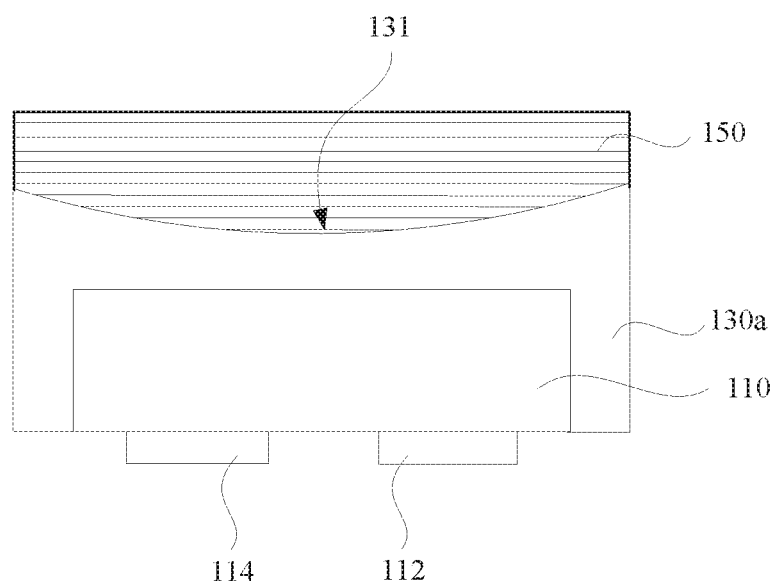
FIGS. 17A-17D are schematic structural diagrams of an LED package structure according to Embodiment 3 of the present disclosure.
Figure 17B:
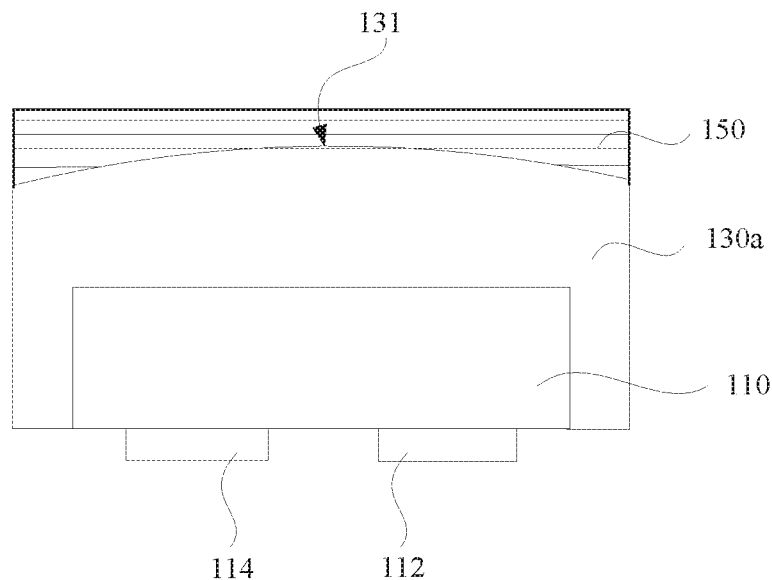

As shown in FIGS. 17A-17D, an LED package structure includes: a light emitting chip 110, a wavelength conversion layer 130a, and a transparent package layer 150, where the light emitting chip 110 has a side surface, an upper surface and a bottom surface, where the bottom surface is provided with an electrode group. The electrode group includes a first electrode 112 and a second electrode 114. The wavelength conversion layer 130a is disposed on the side surface and the upper surface of the light emitting chip 110. The transparent package layer 150 is disposed on a top surface of the wavelength conversion layer, and a contact surface between the wavelength conversion layer and the transparent package layer 150 is an arc-shaped surface 131 protruding upwardly or recessing downwardly. That is, in this embodiment, the contact surface between the transparent package layer 150 and the wavelength conversion layer may be a convex surface (as shown in FIG. 1713), or may be a concave surface (as shown in FIG. 17A), such that the wavelength conversion layer 130a is overlaid with a layer of the transparent package layer 150 which is equivalent to a convex lens or concave lens, and a light emitting angle of the wavelength conversion 130a may be changed. Preferably, the transparent package layer 150 is dispersed with diffuser, resulting in more uniform refraction of light when the light travels through diffusion powder layer. It is found through testing that, when the contact surface between the wavelength conversion layer 130a and the transparent package layer 150 is a convex surface, where the wavelength conversion layer 130a is not overlaid with the transparent package layer 150, luminance degradation of CSP with a large light emitting angle can be improved; however, CIEx and CIEy shift will shift downwardly due to unevenness of a cut surface. When the arc-shaped surface 131 as a contact surface between the wavelength conversion layer 130a and the transparent package layer 150 is a convex surface, and the wavelength conversion layer 130a is overlaid with the transparent package layer 150 which is dispersed with diffuser inside, it is found through testing that, after cutting five surfaces at the same time with evenness cut surfaces, both luminance degradation of CSP with a large light emitting angle as well as the downward shift of CIE shift can be improved.

Accordingly, in the present embodiment, when the contact surface between the wavelength conversion layer 130s and the transparent package layer 150 is an arc-shaped surface 131 protruding upwardly or recessing downwardly, where the transparent package layer 150 is dispersed with diffuser, the problem of luminous unevenness and a shifting of CIE color gamut with an increasing angle when using an existing CSP light emitting device is solved.

Figure 17C:
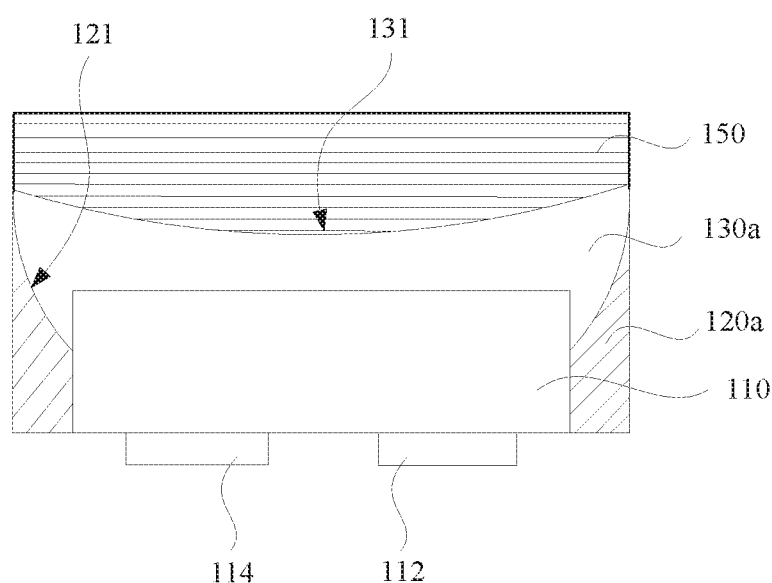

Further, as shown in FIG. 17C, the package structure further includes: a surrounding structure 120a enclosing at least a portion of a side surface of the light emitting chip 110, that is, the surrounding structure 120a may overlay entire side surface of the light emitting chip 110, or overlay a portion of the side surface of the light emitting chip 110, such that the wavelength conversion layer 130a is disposed on an upper surface of the surrounding structure 120a and an upper surface of the light emitting chip 110.

Figure 17D:
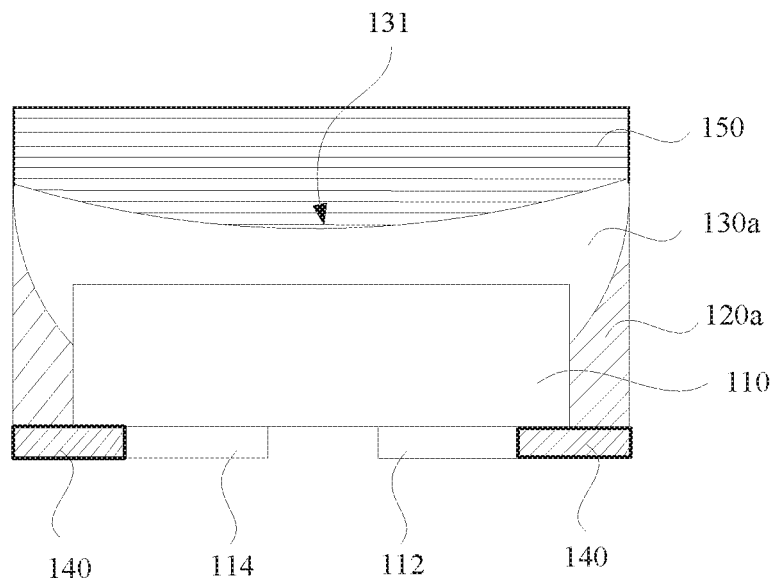

In this embodiment, as shown in FIGS. 17C-17D, an arc-shaped structure 121 is formed on an interface between the wavelength conversion layer 130a and the surrounding structure 120a, where the arc-shaped structure 121 may be a concave surface or a convex surface, specifically, reference may be made to FIGS. 16A-16D. In this embodiment, one end of the arc-shaped structure 121 is extended to align with a top surface of the wavelength conversion layer 130a, and the other end extends to an outer edge of the upper surface of the light emitting chip 110, that is, the surrounding structure 120a is disposed on entire side surface of the light emitting chip 110. Alternatively, as shown in FIG. 17C, one end of the arc-shaped structure 121 extends to the top surface of the wavelength conversion layer 130a, and the other end extends to the side surface of the light emitting chip 110.

Further, referring to FIG. 17D, the package structure further includes: a shading layer 140, where the shading layer 140 is disposed on the bottom surface of the light emitting chip 110 and the bottom surface of the surrounding the structure 120a. Alternatively, in the present embodiment, the shading layer 140 may also overlay the bottom surface and/or the side surface of the surrounding structure 120a. Reference may be made to FIG. 1 to FIG. 13 for specific disposed positions of the shading layer 140, and details are not described in this embodiment.

Embodiment 4

FIGS. 18A-18D are schematic diagrams of a method for manufacturing an LED package structure according to Embodiment 4 of the present disclosure.

Referring to FIGS. 18A-18D, a method for manufacturing the LED package structure according to the present embodiment includes the following steps:

Step 401: providing a support plate with a removable layer 1420.

Where the removable layer 1420 is located on the support plate 1410, the removable layer 1420 may specifically be a pyrolysis gel, that is, a resin material that can be removed after heating.

Step 402: placing a CSP light emitting element on the removable layer 1420, where a light emitting surface of the CSP light emitting element faces toward the removable layer 1420, and an electrode group of the CSP light emitting element is away from the removable layer 1420.

Figure 18A:
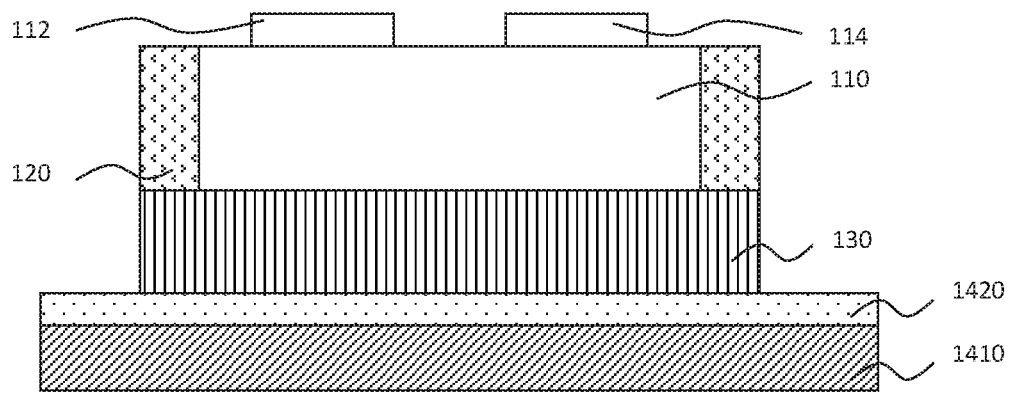
FIGS. 18A-18D are schematic diagrams of a method for manufacturing an LED package structure according to Embodiment 4 of the present disclosure.

Specifically, as shown in FIG. 18A, the CSP light emitting element includes a light emitting chip 110, a surrounding structure 120, and a wavelength conversion layer 130. A bottom surface of the light emitting chip 110 is provided with an electrode group, where the electrode group includes a first electrode 112 and a second electrode 114. There is a gap between the first electrode 112 and the second electrode 114, where when the CSP light emitting element is arranged on the removable layer 1420, the first electrode 112 and the second electrode 114 face upward, the wavelength conversion layer 130 and the removable layer 1420 contact with each other.

Step 403: forming a photoresist pattern 1430 at the gap within the electrode group.

Figure 18B:
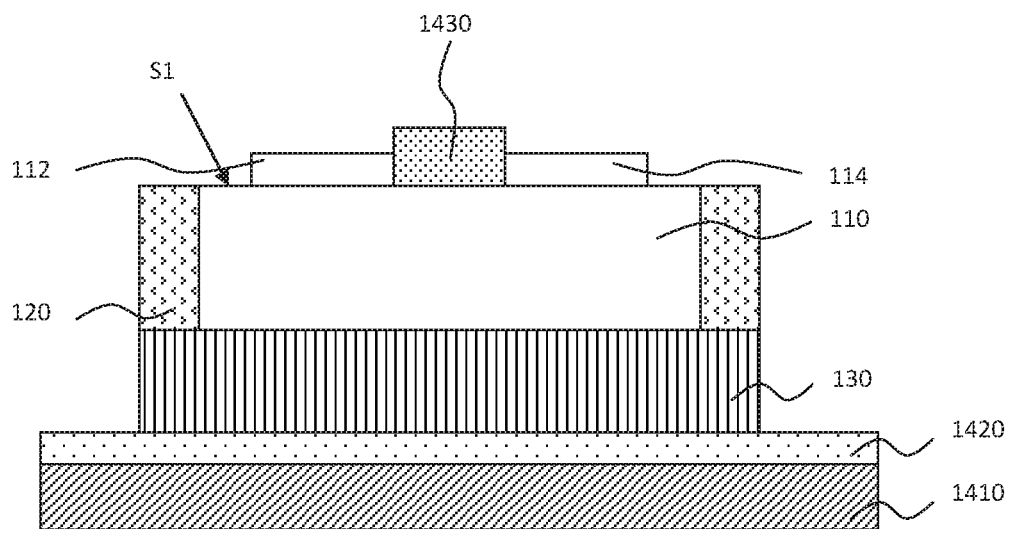

As shown in FIG. 18B, the photoresist pattern 1430 is arranged on the bottom surface of the light emitting chip 110 and located between the first electrode 112 and the second electrode 114.

Step 404: disposing a shading layer 1440 to overlay a side of the CSP light emitting element on which the electrode group is disposed and the electrode group.

Figure 18C:
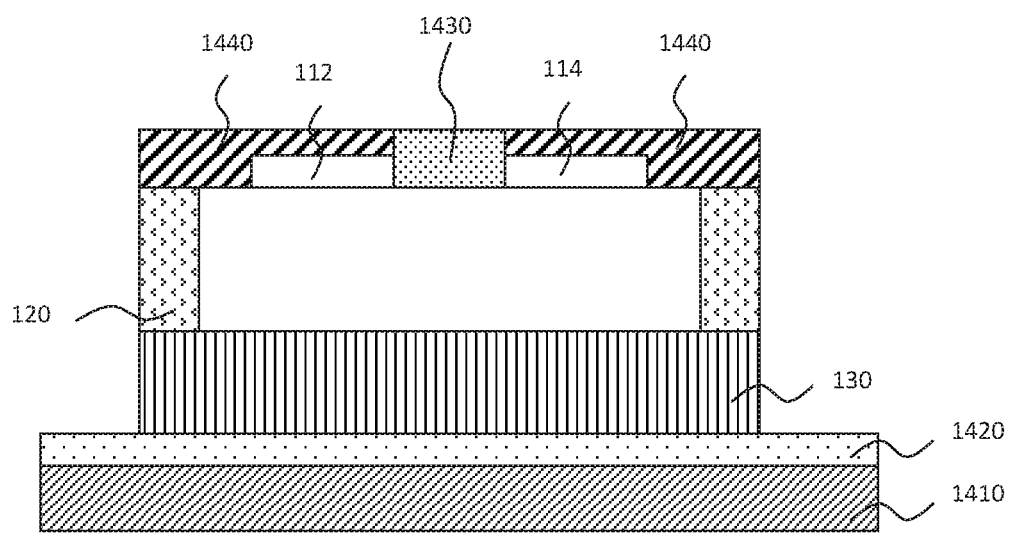

As shown in FIG. 18C, the shading layer 1440 is disposed on the bottom surface S1 of the light emitting chip 110 and the first electrode 112 and the second electrode 114.

Step 405: removing the photoresist pattern 1430, the removable layer 1420, and the support plate 1410 to obtain the LED package structure.

Figure 18D:
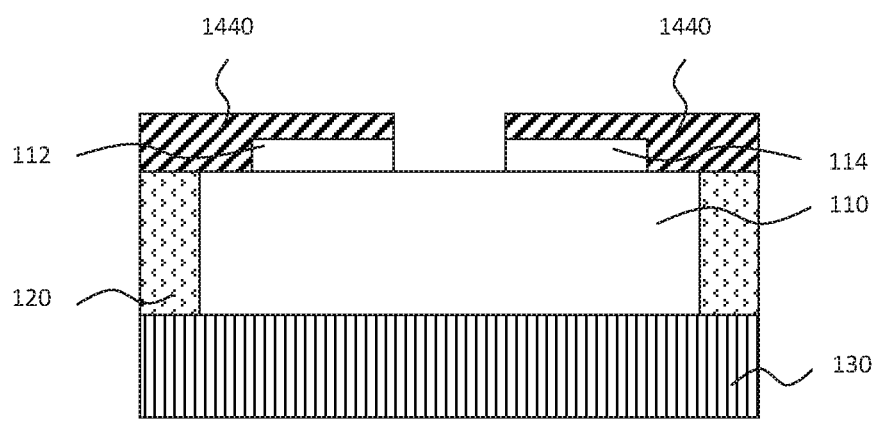

As shown in FIG. 18D, the photoresist pattern 1430 is removed while a heating process is performed to facilitate removal of the removable layer 1420 and the support plate 1410. The obtained LED package structure is shown in FIG. 18D. That is, in this embodiment, a LED package structure shown in FIG. 2 may be obtained through the above method.

Embodiment 5

FIGS. 19A-19D are schematic diagrams of a method for manufacturing an LED package structure according to Embodiment 5 of the present disclosure.

Referring to FIGS. 19A-19D, a method for manufacturing the LED package structure according to the present embodiment includes the following steps:

Step 501: providing a support plate 1410 with a removable layer 1420;

Where the removable layer 1420 is located on the support plate 1410, the removable layer 1420 may specifically he a thermal gel, that is, a resin material that can be removed after heating.

Step 502: placing a CSP light emitting element on the removable layer 1420, where a light emitting surface of the CSP light emitting element faces toward the removable layer 1420, and an electrode group of the CSP light emitting element is away from the removable layer 1420.

Figure 19A:
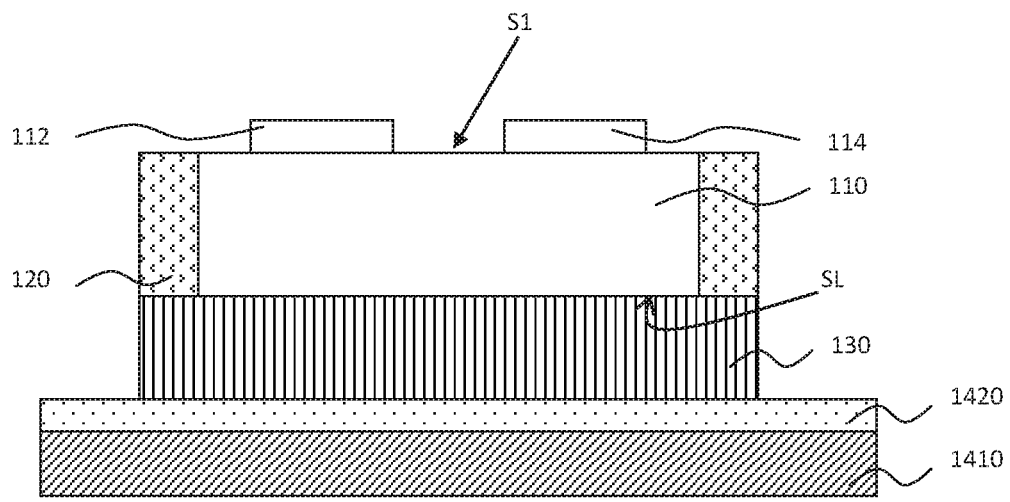
FIGS. 19A-19D are schematic diagrams of a method for manufacturing an LED package structure according to Embodiment 5 of the present disclosure.

Specifically, as shown in FIG. 19A, the CSP light emitting element includes a light emitting chip 110, a surrounding structure 120, and a wavelength conversion layer 130. A bottom surface of the light emitting chip 110 is provided with an electrode group, where the electrode group includes a first electrode 112 and a second electrode 114. There is a gap between the first electrode 112 and the second electrode 114, where when the CSP light emitting element is arranged on the removable layer 1420, the first electrode 112 and the second electrode 114 face upward, the wavelength conversion layer 130 and the removable layer 1420 contact with each other. That is, a light emitting surface SL of the light emitting chip 110 faces downward, and the electrode group faces upward.

Step 503: disposing a photoresist pattern 1530 to overlay a gap within the electrode group and a bottom surface of the electrode group.

Figure 19B:
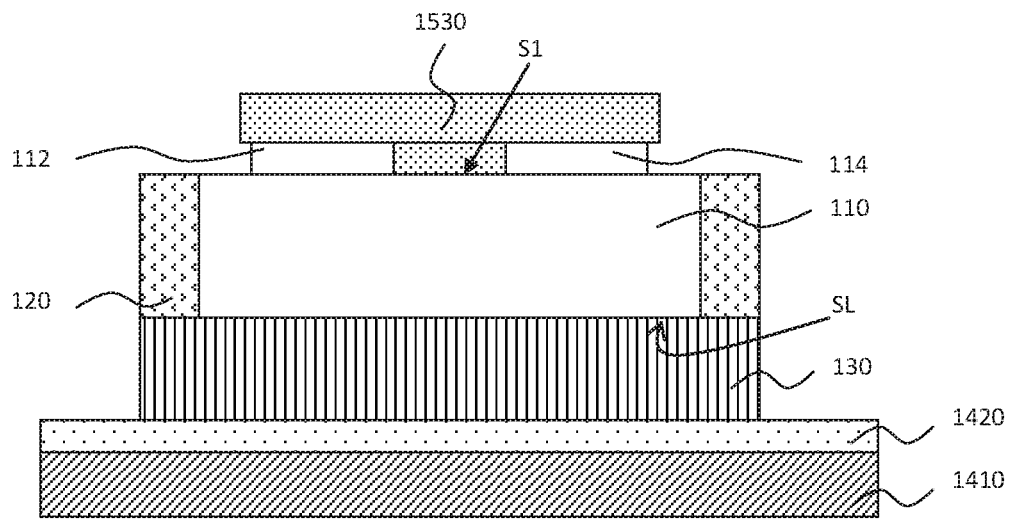

As shown in FIG. 19B, the photoresist pattern 1530 is arranged on the gap between the first electrode 112 and the second electrode 114, and on the bottom surfaces of the first electrode 112 and the second electrode 114, that is, the photoresist pattern 1530 is disposed on the bottom surface of the first electrode 112 and the bottom surface of the second electrode 114.

Step 504: disposing a shading layer 1540 to overlay a side of the CSP light emitting element on which the electrode group is disposed.

Figure 19C:
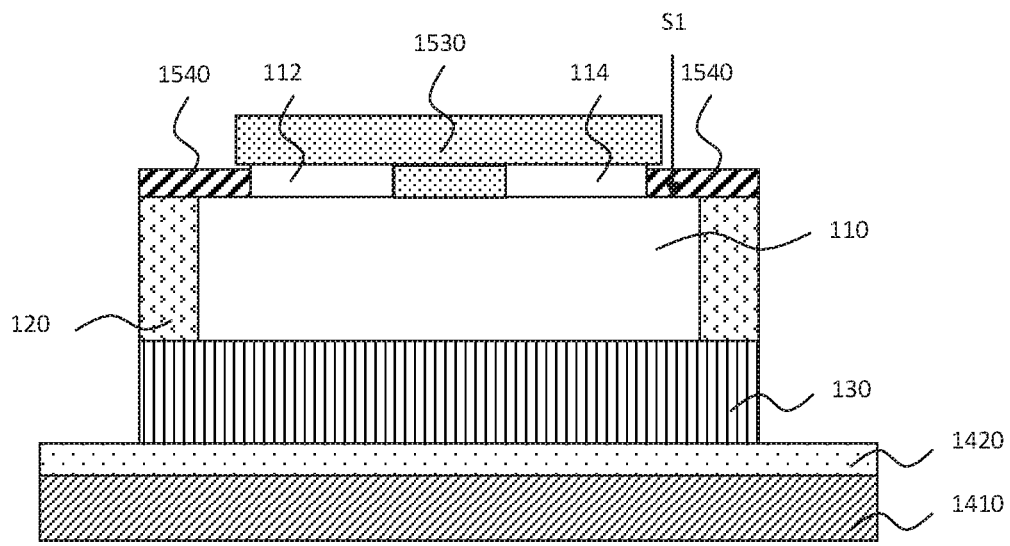

As shown in FIG. 19C, the shading layer 1540 is disposed on the bottom surface of the light emitting chip 110 and the bottom surface of the surrounding structure 120.

Step 505: removing the photoresist pattern 1530, the removable layer 1420, and the support plate 1410 to obtain the LED package structure.

Figure 19D:
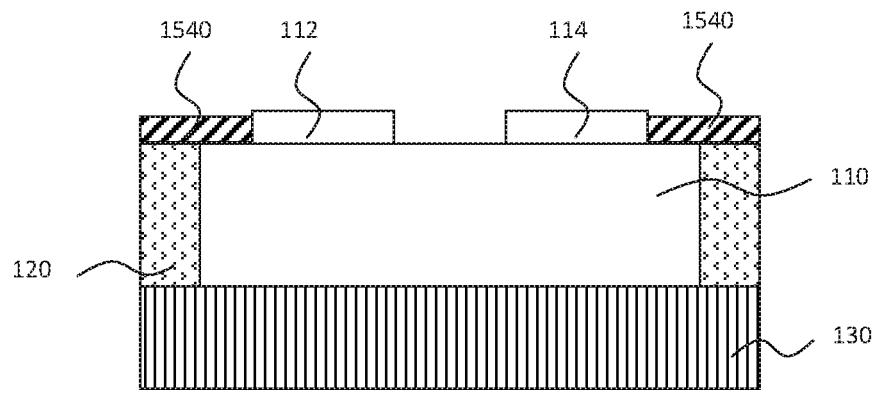

As shown in FIG. 19D, the photoresist pattern 1530 is removed while a heating process is performed to facilitate removal of the removable layer 1420 and the support plate 1410 to obtain an LED package structure as shown in FIG. 19D.

In this embodiment, the shading layer 1540 is disposed on the bottom surface of the light emitting chip 110 and the bottom surface of the surrounding structure 120. The shading layer 1540 is not disposed at the gap between the first electrode 112 and the second electrode 114. An LED package structure as shown in FIG. 1 is finally obtained.

Embodiment 6

FIGS. 20A-20D are schematic diagrams of a method for manufacturing an LED package structure according to Embodiment 6 of the present disclosure.

Referring to FIGS. 20A-20D, a difference between the present embodiment and the above embodiment is that no photoresist pattern 1430 is disposed in the present embodiment. Specifically, the method includes the following steps:

Step 601: providing a support plate 1410 with a removable layer 1420, and forming a first shading layer 1640 of an insulation material on the removable layer 1420.

Figure 20A:
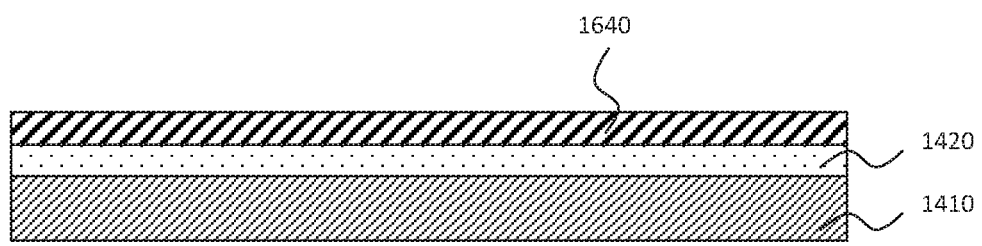
FIGS. 20A-20D are schematic diagrams of a method for manufacturing an LED package structure according to Embodiment 6 of the present disclosure.

As shown in FIG. 20A, the removable layer 1420 is arranged on the support plate 1410, where a first shading layer 1640 is arranged on the removable layer 1420.

Step 602: arranging a light emitting chip 110 on the first shading layer 1640, where an electrode group of the light emitting chip 110 is placed in the first shading layer and extends to the removable layer 1420.

Figure 20B:
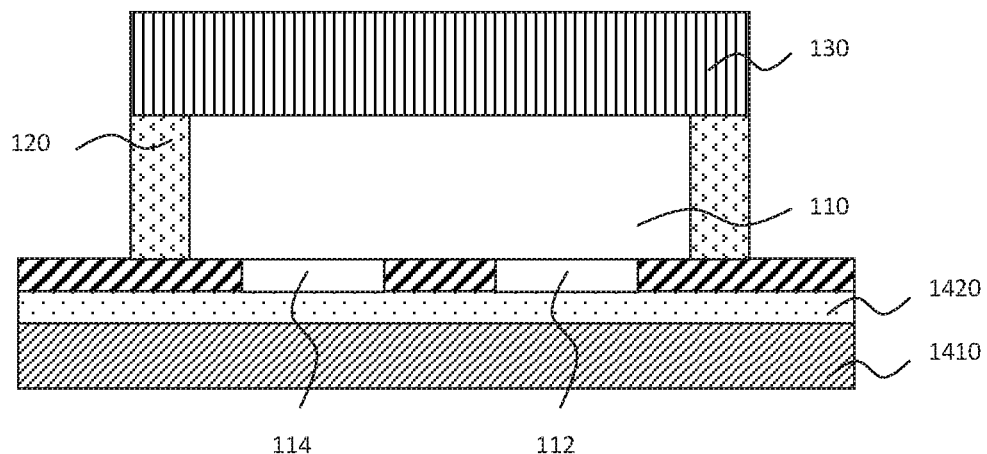

As shown in FIG. 20B, specifically, the first electrode 112 and the second electrode 114 of the light emitting chip 110 are placed in the first shading layer 1640 made from an insulation material through pressing, where a section of the first electrode 112 and a section of the second electrode 114 abut against the removable layer 1420.

Step 603: disposing a surrounding structure 120a on the first shading layer 1640, where the surrounding structure 120a is disposed on a side surface of the light emitting chip 110.

Step 604: disposing a wavelength conversion layer 130 to overlay a top surface of the surrounding structure 120 and an upper surface of the light emitting chip.

Figure 20C:
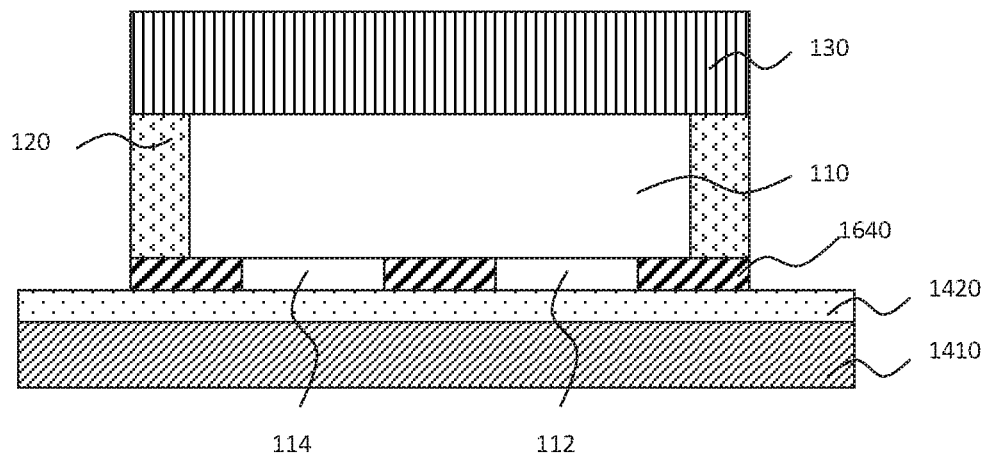

As shown in FIG. 20C, an excess of the first shading layer 1640 made from an insulation material is cut off, such that the shading layer 1640 made from the insulation material and a sidewall of the surrounding structure 120 and the side surface of the wavelength conversion layer 130 are substantially coplanar.

Step 605: removing the removable layer 1420 and the support plate 1410 to obtain the LED package structure.

Figure 20D:
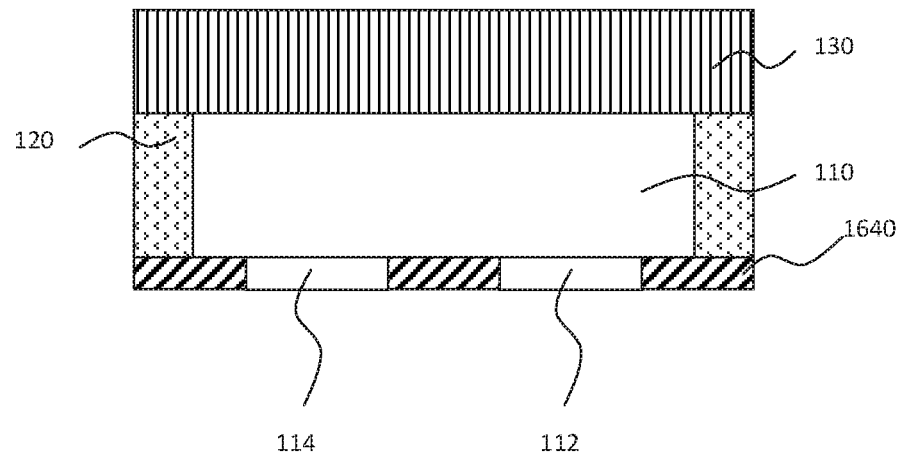

As shown in FIG. 20D, a pyrolysis tape 1420 and a support plate 1410 are removed to obtain an LED package structure 300 of FIG. 3. Light leaking from a bottom surface S1 of the light emitting chip 110 and a bottom of the surrounding structure 120 may be blocked by a structure formed according to the above method through a shading layer 1642. A heating process is performed before removing the support plate 1410 and the pyrolysis tape to facilitate removal of the pyrolysis tape.

In this embodiment, after step 604, the method further includes: disposing a transparent package layer 150 to overlay the wavelength conversion layer 130, where a contact surface between the wavelength conversion layer 130 and the transparent package layer 150 is an arc-shaped surface 131 protruding upwardly or recessing downwardly.

Then step 605 may be performed. An LED package structure as shown in FIG. 15A-15B may be obtained through this approach.

Further, in this embodiment, after step 603, the method further includes: cutting a side surface of the surrounding structure 120; enclosing a second shading layer on the cut side surface of the surrounding structure 120; and disposing the wavelength conversion layer 130 to overlay an upper surface of the second shading layer, an upper surface of the surrounding structure 120, and the upper surface of the light emitting chip 110. Then step 605 may be performed. An LED package structure as shown in FIG. 5 may be obtained through this approach.

Further, in this embodiment, after step 604, the method further includes: cutting a side surface of the surrounding structure and a side surface of the wavelength conversion layer; and disposing a second shading layer to overlay the cut side surface of the surrounding structure 120 and the cut side surface of the wavelength conversion layer 130, where the second shading layer is substantially coplanar with a top surface of the wavelength conversion layer 130. Then step 605 may be performed. An LED package structure as shown in FIG. 4 may be obtained through this approach.

Figure 21A:
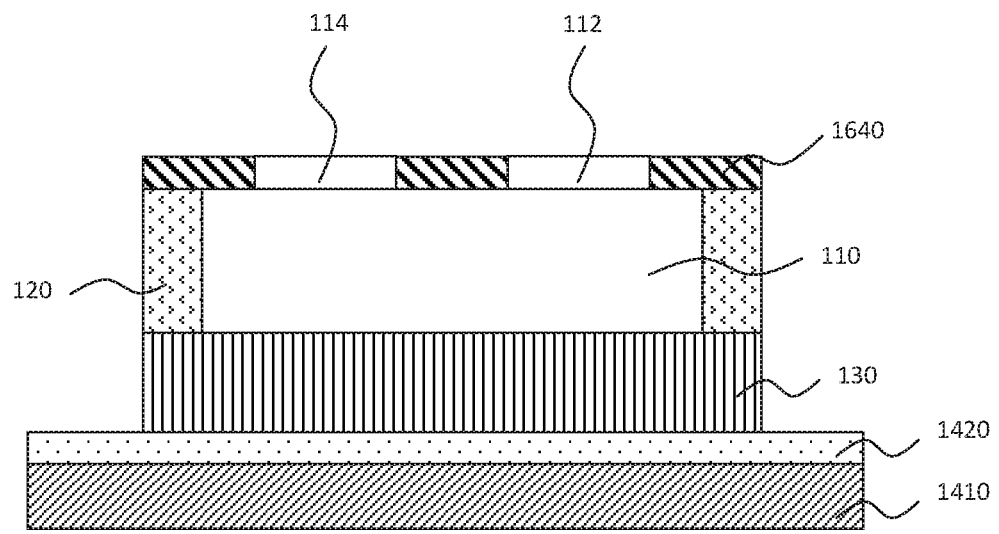
FIGS. 21A-21C are schematic diagrams of a method for manufacturing an LED package structure according to Embodiment 6 of the present disclosure.
Figure 21B:
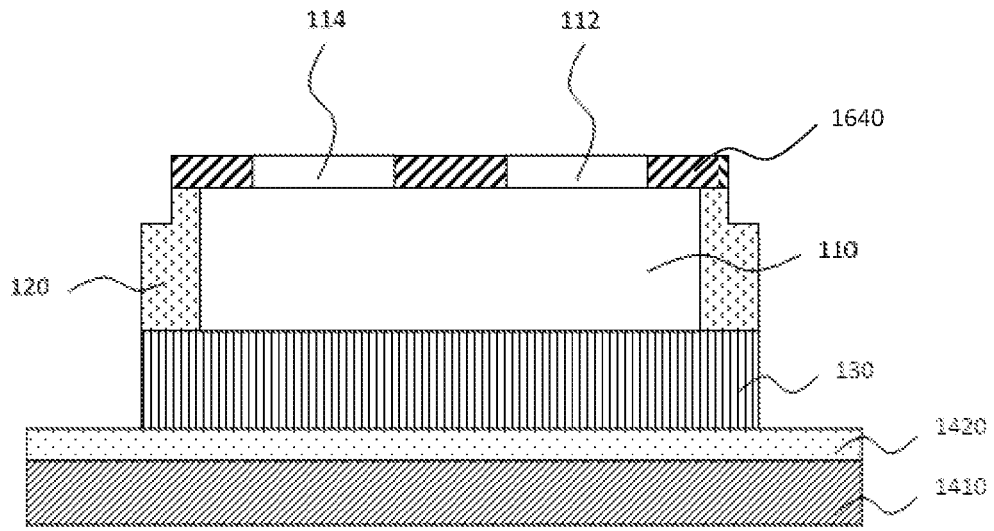
Figure 21C:
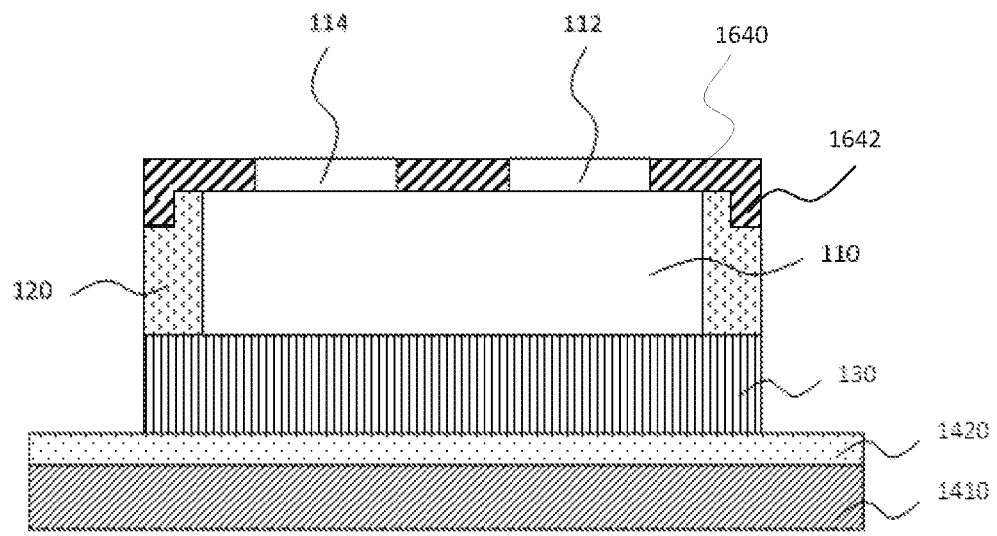

Further, in this embodiment, as shown in FIGS. 21A-21C, after step 605, the method further includes: rearranging the obtained LED package structure on the removable layer 1420 after a flipping of the LED package structure, where the wavelength conversion layer 130 is in contact with the removable layer 1420; cutting a side surface of the surrounding structure 120 and forming a step on the side surface of the surrounding structure 120; and disposing a second shading layer 1642 on the step of the surrounding structure 120, where the second shading layer 1642 is disposed on a side surface of the surrounding structure above the step; and re-removing the removable layer 1420 and the support plate 1410 to obtain an LED package structure as shown in FIG. 6.

Embodiment 7

The difference between the present embodiment and the above embodiments is that a bottom surface of the light emitting chip 110 in an LED package structure obtained in the present embodiment is not overlaid with a shading layer. The manufacturing method includes the following steps:

Step 701: providing a support plate 1410 with a removable layer 1420.

Step 702: arranging a light emitting chip 110 on the removable layer 1420. Specifically, a first electrode 112 and a second electrode 114 of a light emitting chip 110 are directly inserted into the removable layer 1420. Preferably, a bottom surface of the light emitting chip 110 is substantially coplanar with the removable layer 1420.

Step 703: disposing a first shading layer to overlay the removable layer 1420.

Step 704: disposing a surrounding structure 120 on the first shading layer, where the surrounding structure 120 is disposed on a side surface of the light emitting chip 110.

Step 705: disposing a wavelength conversion layer 130 to overlay a top surface of the surrounding structure 120 and an upper surface of the light emitting chip 110.

Step 706: removing the removable layer 1420 and the support plate 1410 to obtain the LED package structure.

The LED package structure as shown in FIG. 7 is obtained through the above steps, where the shading layer is disposed on a bottom surface of the surrounding structure 120.

Further, after step 704, the method further includes: cutting a side surface of the surrounding structure 120; disposing a second shading layer on the cut side surface of the surrounding structure 120; and disposing the wavelength conversion layer 130 to overlay an upper surface of the second shading layer, an upper surface of the surrounding structure, and the upper surface of the light emitting chip 110. Then step 706 may be performed. An LED package structure as shown in FIG. 9 is obtained.

Further, after step 705, the method further includes: cutting the side surface of the surrounding structure 120 and a side surface of the wavelength conversion layer 130; disposing a second shading layer to overlay the cut side surface of the surrounding structure 120 and the side surface of the wavelength conversion layer 130, where a top end of the second shading layer is substantially coplanar with a top surface of the wavelength conversion layer 130. Then step 706 may be performed. An LED package structure as shown in FIG. 10 is obtained.

Further, after step 706, the method further includes: referring to FIGS. 21A-21C, rearranging the LED package structure on the removable layer 1420 after a flipping of the LED package structure, where the wavelength conversion layer 130 is in contact with the removable layer 1420; cutting a side surface of the surrounding structure 120 and the first shading layer and forming a step on the side surface of the surrounding structure 120; disposing a second shading layer on the step of the surrounding structure 120, where the second shading layer is disposed on a side surface of the surrounding structure 120 above the step; and re-removing the removable layer 1420 and the support plate 1410. An LED package structure as shown in FIG. 8 is obtained.

Embodiment 8

The difference between the present embodiment and the above embodiments is that a bottom surface of the light emitting chip 110 and a bottom surface of the surrounding structure 120 in an LED package structure obtained in the present embodiment are not overlaid with a shading layer. The manufacturing method includes the following steps:

Step 801: providing a support plate 1410 with a removable layer 1420.

Step 802: arranging a light emitting chip 110 on the removable layer 1420.

Step 803: disposing a surrounding structure on the removable layer 1420, where the surrounding structure is disposed on a side surface of the light emitting chip 110.

Step 804: disposing a wavelength conversion layer 130 to overlay a top surface of the surrounding structure 120 and an upper surface of the light emitting chip 110.

Step 805: cutting a side surface of the surrounding structure 120 and a side surface of the wavelength conversion layer 130.

Step 806: disposing a shading layer to overlay the cut side surface of the surrounding structure 120 and the side surface of the wavelength conversion layer 130.

Step 807: removing the removable layer 1420 and the support plate 1410 to obtain the LED package structure.

An LED package structure as shown in FIG. 11 is obtained through the above steps, that is, a shading layer is disposed on the side surface of the surrounding structure 120 and the side surface of the wavelength conversion layer 130, thereby preventing light from leaking out of the side surface of the surrounding structure and the side surface of the wavelength conversion layer 130 of the LED package structure.

Further, after step 803, the method further includes: cutting the side surface of the surrounding structure 120; disposing a shading layer to overlay the cut side surface of the surrounding structure 120; and disposing a wavelength conversion layer 130 to overlay a top surface of the shading layer, a top surface of the surrounding structure 120 and an upper surface of the light emitting chip 110. Then step 807 may be performed. An LED package structure as shown in FIG. 12 is obtained.

Further, after step 804, the method further includes: heating the support plate 1410, and rearranging the light emitting chip 110, the surrounding structure 120 and the wavelength conversion layer 130 on the removable layer 1420 after flipping the three, where the wavelength conversion layer 130 is in contact with the removable layer 1420, where an electrode group of the light emitting chip 110 is away from the removable layer 1420 (reference may be made to FIG. 21A); cutting the side surface of the surrounding structure 120 and forming a step on the side surface of the surrounding structure 120; and disposing a shading layer on the cut side surface of the surrounding structure 120 above the step, where the shading layer is substantially coplanar with a bottom surface of the surrounding structure 120. Then step 807 may be performed to obtain an LED package structure as shown in FIG. 13.

At last, it should be noted that the above embodiments are merely illustrative of technical solutions of the present disclosure, and are not intended to be construed in a limiting sense. While the present disclosure has been described in detail with reference to the foregoing embodiments, those skilled in the art will understand that various modifications may be made to the technical solutions described in the foregoing embodiments, equivalents or replacements may be made to some or all of the technical features; and the modifications or replacements do not deviate from the scope of the technical solutions of various embodiments according to the present disclosure.

What is claimed is:

1. A Light Emitting Diode (LED) package structure, comprising:
    a chip scale package (CSP) light emitting element, wherein the CSP light emitting element comprises a light emitting chip, the light emitting chip comprises an electrode group located on a bottom surface of the light emitting chip; and
    a shading layer, wherein the shading layer is disposed on a bottom surface or a side surface of the CSP light emitting element, or the shading layer is disposed on the bottom surface and the side surface of the CSP light emitting element;
    wherein the CSP light emitting element comprises a wavelength conversion layer, a side surface of the shading layer and a side surface of the wavelength conversion layer are substantially coplanar.

2. The LED package structure according to claim 1, the CSP light emitting element further comprising:
    a surrounding structure enclosing the side surface of the light emitting chip,
    wherein the wavelength conversion layer is disposed on an upper surface of the light emitting chip and the surrounding structure, and an arc-shaped structure is formed on an interface between the wavelength conversion layer and the surrounding structure.

3. The LED package structure according to claim 2, wherein one end of the arc-shaped structure is substantially coplanar with a top surface of the wavelength conversion layer, and the other end extends to an outer edge of the upper surface of the light emitting chip.

4. The LED package structure according to claim 2, wherein one end of the arc-shaped structure is substantially coplanar with a top surface of the wavelength conversion layer, and the other end extends to the side surface of the light emitting chip.

5. The LED package structure according to claim 2, wherein the arc-shaped structure is a convex surface curved upward, or
    the arc-shaped structure is a concave surface curved downward.

6. The LED package structure according to claim 2, further comprising:
    a transparent package layer being disposed on the wavelength conversion layer, wherein a contact surface between the wavelength conversion layer and the transparent package layer is an arc-shaped surface protruding upwardly or recessing downwardly.

7. The LED package structure according to claim 6, wherein diffuser are dispersed in the transparent package layer.

8. The LED package structure according to claim 1, wherein the shading layer is disposed on the bottom surface of the light emitting chip.

9. The LED package structure according to claim 1, wherein the shading layer is disposed on the electrode group.

10. The LED package structure according to claim 1, wherein the CSP light emitting element comprises a surrounding structure enclosing the side surface of the light emitting chip, wherein the shading layer is disposed on the bottom surface or at least a portion of the side surface of the surrounding structure, or the shading layer is disposed on the bottom surface and at least a portion of the side surface of the surrounding structure.

11. A Light Emitting Diode (LED) package structure, comprising:
    a light emitting chip having a side surface, an upper surface and a bottom surface, wherein the bottom surface is disposed with an electrode group;
    a surrounding structure enclosing the side surface of the light emitting chip;
    a wavelength conversion layer being disposed on the upper surface of the light emitting chip and the surrounding structure, wherein an arc-shaped structure is formed on an interface between the wavelength conversion layer and the surrounding structure; and
    a shading layer, wherein a side surface of the shading layer is substantially coplanar with a side surface of the wavelength conversion layer.

12. The LED package structure according to claim 11, wherein one end of the arc-shaped structure is substantially coplanar with a top surface of the wavelength conversion layer, and the other end extends to an outer edge of the upper surface of the light emitting chip.

13. The LED package structure according to claim 11, wherein one end of the arc-shaped structure is substantially coplanar with a top surface of the wavelength conversion layer, and the other end extends to the side surface of the light emitting chip.

14. The LED package structure according to claim 11, wherein the arc-shaped structure is a convex surface curved upward, or
    the arc-shaped structure is a concave surface curved downward.

15. The LED package structure according to claim 11, wherein the shading layer is disposed on a bottom surface or a side surface of the LED package structure, or disposed on the bottom surface and the side surface of the LED package structure.

16. The LED package structure according to claim 11, further comprising:
a shading layer being disposed on the bottom surface of the light emitting chip.

17. The LED package structure according to claim 11, further comprising:
a shading layer being disposed on the electrode group.

18. The LED package structure according to claim 11, wherein the shading layer is disposed on a bottom surface or at least a portion of a side surface of the surrounding structure, or the shading layer is disposed on a bottom surface and at least a portion of a side surface of the surrounding structure.

19. The LED package structure according to claim 11, further comprising:
a transparent package layer being disposed on a top surface of the wavelength conversion layer, wherein a contact surface between the wavelength conversion layer and the transparent package layer is an arc-shaped surface protruding upwardly or recessing downwardly.

20. The LED package structure according to claim 19, wherein diffuser are dispersed in the transparent package layer.

21. A Light Emitting Diode (LED) package structure, comprising:
a light emitting chip having a side surface, an upper surface and a bottom surface, wherein the bottom surface is disposed with an electrode group;
a wavelength conversion layer being disposed on the side surface and the upper surface of the light emitting chip;
a transparent package layer being disposed on a top surface of the wavelength conversion layer, wherein a contact surface between the wavelength conversion layer and the transparent package layer is an arc-shaped surface protruding upwardly or recessing downwardly; and
a surrounding structure disposed on at least a portion of the side surface of the light emitting chip, wherein the wavelength conversion layer is disposed on an upper surface of the surrounding structure and the upper surface of the light emitting chip.

22. The LED package structure according to claim 21, wherein diffuser are dispersed in the transparent package layer.

23. The LED package structure according to claim 21, wherein an arc-shaped structure is formed on an interface between the surrounding structure and the wavelength conversion layer.

24. The LED package structure according to claim 23, wherein one end of the arc-shaped structure extends to a top surface of the wavelength conversion layer, and the other end extends to an outer edge of the upper surface of the light emitting chip.

25. The LED package structure according to claim 23, wherein one end of the arc-shaped structure extends to a top surface of the wavelength conversion layer, and the other end extends to the side surface of the light emitting chip.

26. The LED package structure according to claim 23, wherein the arc-shaped structure is a convex surface curved upward, or
the arc-shaped structure is a concave surface curved downward.

27. The LED package structure according to claim 21, further comprising:
a shading layer being disposed on the bottom surface of the light emitting chip and the bottom surface of the surrounding structure.

28. The LED package structure according to claim 21, further comprising:
a shading layer, wherein the shading layer is disposed on a bottom surface of the surrounding structure or a side surface of the surrounding structure, or the shading layer is disposed on both of the bottom surface and the side surface of the surrounding structure.

* * * * *